(12) United States Patent
Ueda

(10) Patent No.: US 8,830,371 B2
(45) Date of Patent: Sep. 9, 2014

(54) IMAGE PICKUP APPARATUS INCLUDING IMAGE PICKUP ELEMENT PROVIDED WITH CHARGE HOLDING PORTION, CONTROL METHOD AND CONTROL PROGRAM THEREFOR, AND STORAGE MEDIUM

(75) Inventor: Toshiharu Ueda, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 183 days.

(21) Appl. No.: 13/514,266

(22) PCT Filed: Dec. 3, 2010

(86) PCT No.: PCT/JP2010/072186
§ 371 (c)(1),
(2), (4) Date: Jun. 6, 2012

(87) PCT Pub. No.: WO2011/071132
PCT Pub. Date: Jun. 16, 2011

(65) Prior Publication Data
US 2012/0236191 A1 Sep. 20, 2012

(30) Foreign Application Priority Data
Dec. 9, 2009 (JP) ................................. 2009-279438

(51) Int. Cl.
| | |
|---|---|
| H04N 5/228 | (2006.01) |
| H01L 27/00 | (2006.01) |
| H04N 5/353 | (2011.01) |
| H04N 5/3745 | (2011.01) |
| H01L 27/146 | (2006.01) |

(52) U.S. Cl.
CPC ..... *H01L 27/14609* (2013.01); *H01L 27/14643* (2013.01); *H04N 5/3535* (2013.01); *H04N 5/3745* (2013.01)
USPC ........................................ 348/308; 250/208.1

(58) Field of Classification Search
CPC .................................................. H01L 27/14609
USPC ........................................... 348/308; 250/214
See application file for complete search history.

(56) References Cited

U.S. PATENT DOCUMENTS

2002/0190193 A1* 12/2002 Mizuno et al. ............ 250/214 R

FOREIGN PATENT DOCUMENTS

| | | |
|---|---|---|
| JP | H06-196742 A | 7/1994 |
| JP | H06-217410 A | 8/1994 |

(Continued)

OTHER PUBLICATIONS

Japanese Office Action dated Nov. 5, 2013 for corresponding application No. 2009-279438.

(Continued)

*Primary Examiner* — Joel Fosselman
(74) *Attorney, Agent, or Firm* — Carter, DeLuca, Farrell & Schmidt, LLP

(57) ABSTRACT

An image pickup apparatus capable of reducing the influence of dark current noise to thereby obtain excellent image quality, even when the dynamic range is expanded under a photographing condition. In an image pickup element of a CMOS image sensor of the apparatus, a photo diode (PD) generates and accumulates electric charge according to an optical input, and a floating diffusion portion (FD) accumulates the electric charges. A charge holding portion (MEM) is disposed between PD and FD. A first transfer transistor selectively separates and connect between PD and MEM, and a second transfer transistor selectively separates and connects between MEM and FD. A system control circuit sets an operation mode to either a first operation mode in which PD and MEM are separated or a second operation mode according to photographing conditions for shooting an object in which PD and MEM are connected.

6 Claims, 15 Drawing Sheets

(56) References Cited

FOREIGN PATENT DOCUMENTS

| | | |
|---|---|---|
| JP | H06-246450 A | 9/1994 |
| JP | 2001-145030 A | 5/2001 |
| JP | 2006-196742 A | 7/2006 |
| JP | 2006-246450 A | 9/2006 |
| JP | 2008-167096 A | 7/2008 |
| JP | 2008-187255 A | 8/2008 |
| JP | 2008-205639 A | 9/2008 |
| KR | 10-0591075 B1 | 6/2006 |

OTHER PUBLICATIONS

Korean Office Action dated Feb. 20, 2014 for corresponding application No. 10-2012-7014664.

* cited by examiner

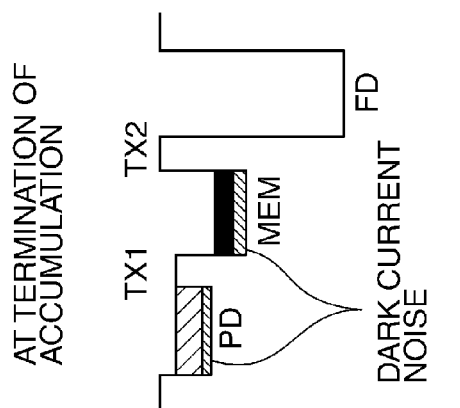
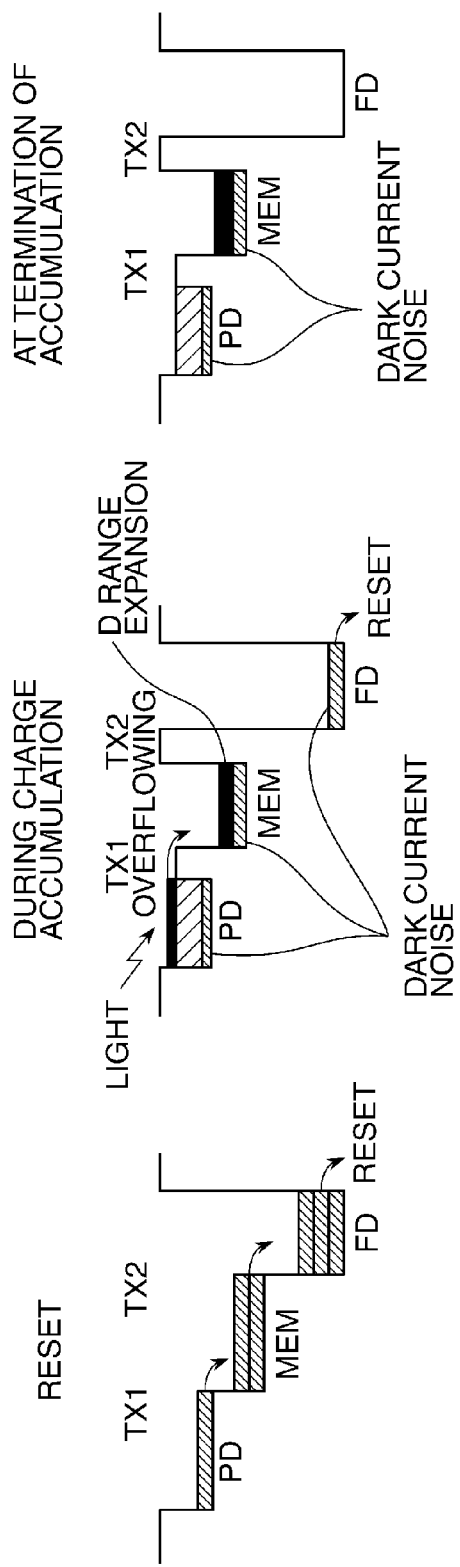
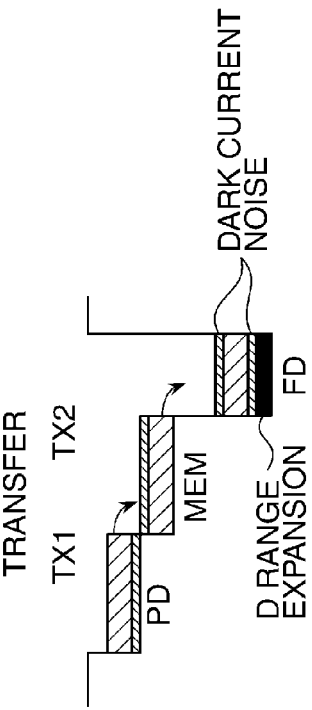

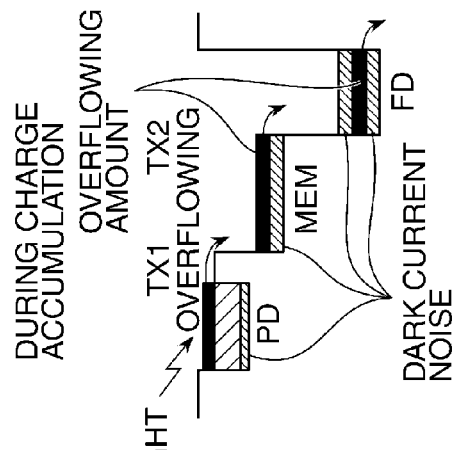
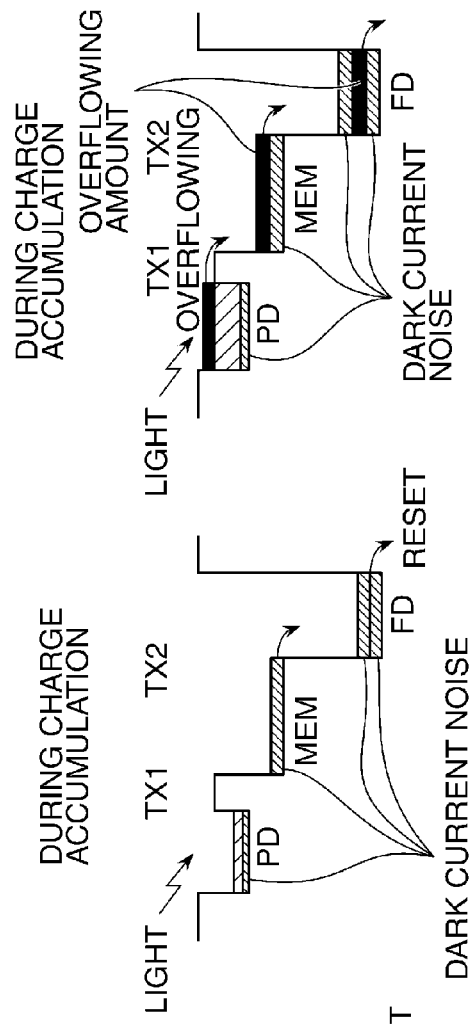
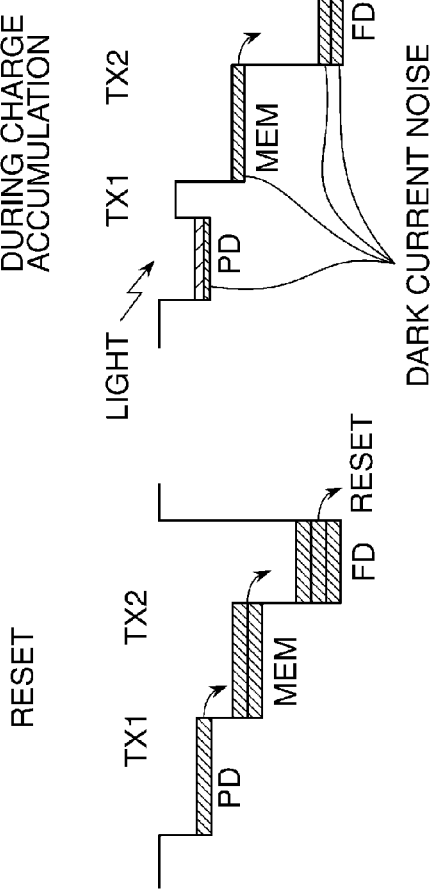
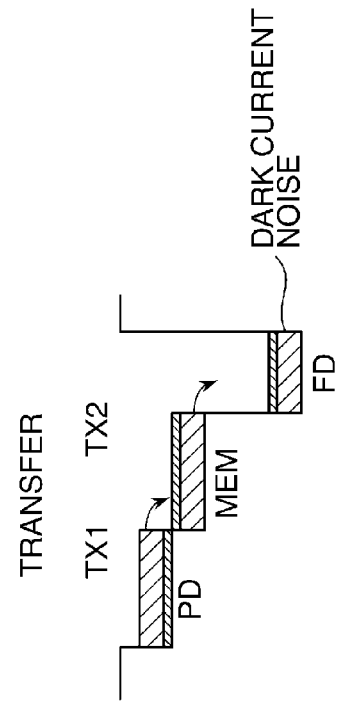
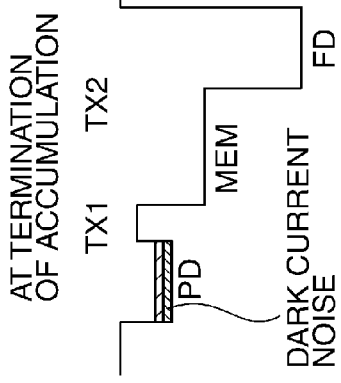

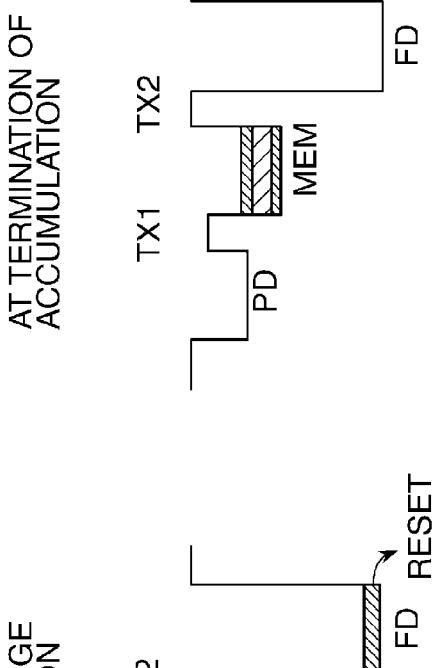
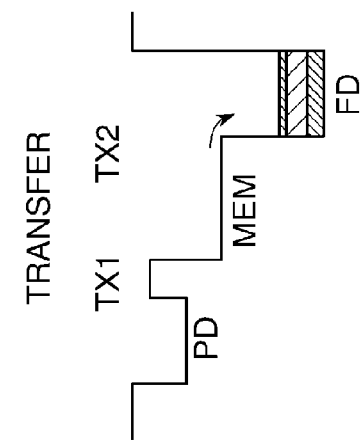
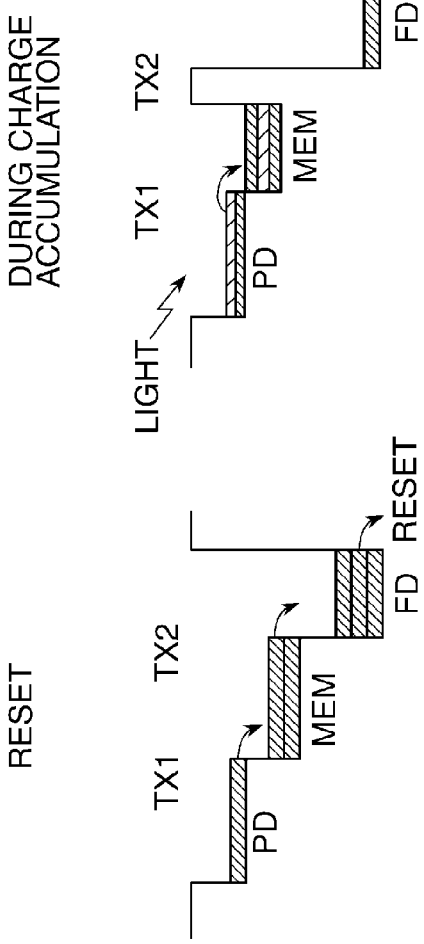

FIG. 13
RELATED ART
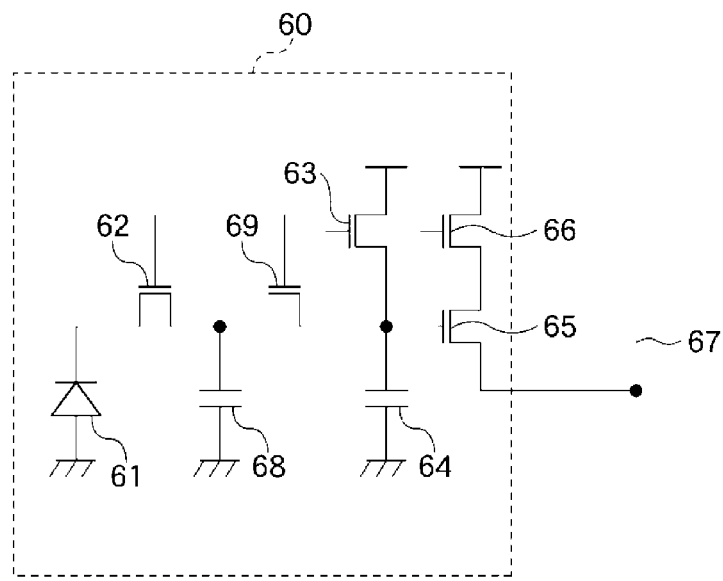
FIG. 14
RELATED ART
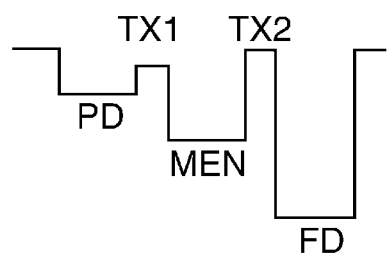
FIG. 15
RELATED ART
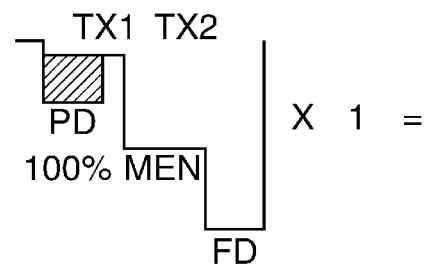 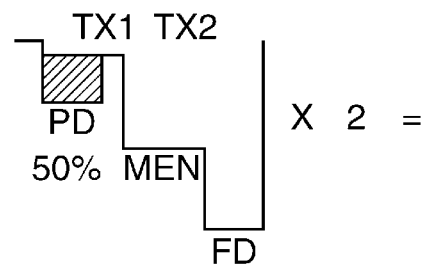

IMAGE PICKUP APPARATUS INCLUDING IMAGE PICKUP ELEMENT PROVIDED WITH CHARGE HOLDING PORTION, CONTROL METHOD AND CONTROL PROGRAM THEREFOR, AND STORAGE MEDIUM

TECHNICAL FIELD

The present invention relates to an image pickup apparatus using an image pickup sensor, such as a CMOS image sensor, a control method and a control program therefor, and a storage medium, and more particularly to an image pickup apparatus in which image pickup elements forming the image pickup sensor are each provided with a charge holding portion, a control method therefor, a computer-executable program for executing the control method, and a computer-readable storage medium storing the computer-executable program.

BACKGROUND ART

In general, an image pickup sensor, such as a CMOS image sensor, has a plurality of image pickup elements, each of which defines a unit pixel (corresponding to one pixel). In recent years, in an image pickup apparatus, such as a digital camera or a video camera, an image pickup sensor, such as a CCD (Charge Coupled Device) or a CMOS (Complementary Metal Oxide Semiconductor) image sensor is used.

Further, as the pixel size reduction and the like due to a higher pixel count proceeds, there has been an increasing demand for ideas and devices for expanding the dynamic range of an image pickup sensor with respect to an optical input (i.e. optical signal) thereto.

For example, in PTL 1 to PTL 3, there have been proposed techniques in which a charge holding portion other than a floating diffusion portion is provided in each image pickup element that defines a unit pixel, and the dynamic range is expanded by the charge holding portion.

As mentioned above, in PTL 1 to PTL 3, each image pickup element has a structure provided with the charge holding portion different from the floating diffusion portion. Particularly, in PTL 2 and PTL 3, electric charge overflowing from a photo diode during charge accumulation time is accumulated in the charge holding portion via an overflow gate, and the dynamic range is ensured thereby.

Now, FIG. 13 is a diagram showing an example of a circuit forming a pixel 60 used for a CMOS image sensor.

For example, the CMOS image sensor has a plurality of pixels 60, and these pixels 60 are arranged in a matrix form in the CMOS image sensor.

The pixel 60 illustrated in the figure has a photo diode (hereinafter referred to as "PD") 61. The PD 61 receives an optical input (i.e. optical image) subjected to image formation by a photographic lens (not shown) to thereby generate and accumulate electric charge. A first transfer transistor 62 is a transistor used as a first transfer switch and is implemented by a MOS transistor.

A floating diffusion portion (hereinafter referred to as "FD") 64 holds electric charge accumulated in the PD 61 as voltage. A reset transistor 63 resets the electric potential of the FD 64. An amplifier transistor 65 is connected as a source follower to the FD 64, and a row selection transistor 66 is used for selecting a row of pixels in the CMOS image sensor. The output voltage is output to a vertical output line 67 via the row selection transistor 66.

A charge holding portion (hereinafter referred to as "MEM") 68 is arranged between the PD 61 and the FD 64.

Electric charge is transferred from the PD 61 to the MEM 68 via the first transfer transistor 62. The electric charge accumulated in the MEM 68 is transferred to the FD 64 via a second transfer transistor 69 used as a second transfer switch.

FIG. 14 is a diagram illustrating potentials in the above-mentioned pixel 60. In FIG. 14, a barrier TX1 defined by the first transfer transistor 62 exists between the PD 61 and the MEM 68. Further, a barrier TX2 defined by the second transfer transistor 69 exists between the MEM 68 and the FD 64.

The barrier TX1 between the PD 61 and the MEM 68 is configured such that it is higher than a maximum electric charge which can be stored (hereinafter referred to as "charge storage capacity") and at the same time, an overflowing electric charge from the PD 61 flows out in a direction toward the MEM 68. When electric charge generated by an optical input exceeds the charge storage capacity of the PD 61, electric charge flows over the barrier TX1 and is stored in the MEM 68.

It should be noted that depending on the capacity configuration of the MEM 68, it may be configured such that during charge accumulation, electric charge accumulated in the PD 61 is always transferred to the MEM 68 by activating the first transfer transistor 62.

By the way, not only in the PD 61 and the FD 64 but also in the MEM 68, noise occurs which is caused by dark current that increases as time elapses. Therefore, when the dynamic range is expanded by accumulating electric charge generated by the optical input in the PD 61 and the MEM 68, during charge accumulation, it is impossible to eliminate a noise component caused by dark current in the MEM 68.

As a consequence, when a comparison is made between a pixel without the MEM 68 and the pixel 60 with the MEM 68, even when the conditions, such as the areas of the PD 61 and the FD 64, of the two are the same, the pixel 60 with the MEM 68 delivers a larger noise to the CMOS image sensor, due to a noise component caused by dark current in the MEM 68.

Further, in high sensitivity photographing or the like in which amplification is performed at a later stage than the pixel 60 or in a later stage than the CMOS image sensor, an insufficient dynamic range of the pixel 60 is less liable to occur since the optical input is inherently small. For this reason, it is not very necessary to expand the dynamic range.

FIG. 15 is a diagram showing an example of difference in the amount of electric charge to be accumulated in the PD 61 occurring depending on the configuration of photographic recording sensitivity when obtaining an image by the same exposure.

The photographic recording sensitivity (ISO sensitivity) in an image pickup apparatus is determined by "electric charge accumulated in the PD 61×circuit gain in a later stage". Therefore, when photographing is performed with the same exposure with respect to a luminance of an object, ISO 100=100% of electric charge amount in the PD 61×a circuit gain of 1, and ISO 200=50% of electric charge amount in the PD 61×a circuit gain of 2. Therefore, as the ISO sensitivity becomes higher, the margin to the capacity of the PD 61 increases (i.e. electric charge is less likely to overflow).

Further, since the optical input required by the PD 61 becomes smaller, an insufficient dynamic range of the pixel 60 is less liable to occur. On the other hand, if the dynamic range is expanded, the noise component caused by dark current dependent on time is generated as much as in low sensitivity photographing, and the noise component due to dark current is amplified since the amplification is performed in the later stage, which tends to degrade image quality liable to occur.

For example, in the case of ISO 100, the circuit gain in the later stage is 1, so that the dark current generated in the pixel 60 has an influence corresponding to the generated amount thereof. However, in the case of ISO 200, the circuit gain in the later stage is doubled, so that the dark current has an influence corresponding to twice as much as the generated amount thereof.

CITATION LIST

Patent Literature

PTL 1: JP 6-196742
PTL 2: JP 6-217410 A
PTL 3: JP 6-246450 A

SUMMARY OF INVENTION

Technical Problem

The present invention provides an image pickup apparatus which is capable of reducing the influence of dark current noise to thereby obtain excellent image quality, even when the dynamic range is expanded under a photographing condition, such as high sensitivity photographing, a control method and a control program therefor, and a storage medium.

Solution of Problem

Accordingly, in a first aspect of the present invention, there is provided a image pickup apparatus comprising a photoelectric conversion element configured to generate and accumulate electric charge according to an optical input, a charge accumulation portion configured to accumulate the electric charge, a charge holding portion disposed between the photoelectric conversion element and the charge accumulation portion, a first transfer switch configured to selectively separate and connect between the photoelectric conversion element and the charge holding portion, a second transfer switch configured to selectively separate and connect between the charge holding portion and the charge accumulation portion, and a controller configured to set an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to a photographing condition for performing photographing of an object.

Accordingly, in a second aspect of the present invention, there is provided a method of controlling an image pickup apparatus including a photoelectric conversion element configured to generate and accumulate electric charge according to an optical input, a charge accumulation portion configured to accumulate the electric charge, a charge holding portion disposed between the photoelectric conversion element and the charge accumulation portion, a first transfer switch configured to selectively separate and connect between the photoelectric conversion element and the charge holding portion, and a second transfer switch configured to selectively separate and connect between the charge holding portion and the charge accumulation portion, the method comprising setting an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to a photographing condition for performing photographing of an object.

Accordingly, in a third aspect of the present invention, there is provided a computer-executable program for causing a computer to execute a method of controlling an image pickup apparatus including a photoelectric conversion element configured to generate and accumulate electric charge according to an optical input, a charge accumulation portion configured to accumulate the electric charge, a charge holding portion disposed between the photoelectric conversion element and the charge accumulation portion, a first transfer switch configured to selectively separate and connect between the photoelectric conversion element and the charge holding portion, and a second transfer switch configured to selectively separate and connect between the charge holding portion and the charge accumulation portion, wherein the method comprises setting an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to a photographing condition for performing photographing of an object.

Accordingly, in a fourth aspect of the present invention, there is provided a non-transitory computer-readable storage medium storing the computer-executable program.

Advantageous Effects of Invention

According to the present invention, since the operation mode is selectively switched between the first and second operation modes according to the photographing condition, even when the dynamic range is expanded in high-sensitivity photographing or the like, it is possible to obtain the advantageous effect that excellent image quality is obtained by reducing the influence of dark current noise. That is, depending on the photographing condition, when a wide dynamic range is required, the operation is configured to be performed with priority to securing of a dynamic range. On the other hand, when there is a sufficient dynamic range margin, the operation is configured to be performed with priority to elimination of the noise due to dark current. Therefore, it is possible to obtain advantageous effect of obtaining appropriate image quality depending on the photographing condition.

The features and advantages of the present invention will become more apparent from the following detailed description taken in conjunction with the accompanying drawings.

BRIEF DESCRIPTION OF DRAWINGS

FIG. 4A A diagram showing potentials in a pixel of the CMOS image sensor shown in FIG. 2 in the first operation mode thereof when the pixel is reset.

FIG. 4B A diagram showing potentials in the pixel of the CMOS image sensor shown in FIG. 2 in the first operation mode thereof when electric charge is accumulated.

FIG. 4C A diagram showing potentials in the pixel of the CMOS image sensor shown in FIG. 2 in the first operation mode thereof when accumulation of electric charge is terminated.

FIG. 4D A diagram showing potentials in the pixel of the CMOS image sensor shown in FIG. 2 in the first operation mode thereof when electric charge is transferred.

FIG. 6A A diagram showing potentials in the pixel of the CMOS image sensor shown in FIG. 2 in the second operation mode thereof when the pixel is reset.

FIG. 6B A diagram showing one example of potentials in the pixel of the CMOS image sensor shown in FIG. 2 in the second operation mode thereof when electric charge is accumulated.

FIG. 6C A diagram showing another example of potentials in the pixel of the CMOS image sensor shown in FIG. 2 in the second operation mode thereof when electric charge is accumulated.

FIG. 6D A diagram showing one example of potentials in the pixel of the CMOS image sensor shown in FIG. 2 in the second operation mode thereof when accumulation of electric charge is terminated.

FIG. 6E A diagram showing potentials in the pixel of the CMOS image sensor shown in FIG. 2 in the second operation mode thereof when electric charge is transferred.

FIG. 7A A diagram showing potentials in the pixel of the CMOS image sensor shown in FIG. 2 in a conventional operation thereof when the pixel is reset.

FIG. 7B A diagram showing potentials in the pixel of the CMOS image sensor shown in FIG. 2 in the conventional operation thereof when electric charge is accumulated.

FIG. 7C A diagram showing potentials in the pixel of the CMOS image sensor shown in FIG. 2 in the conventional operation thereof when accumulation of electric charge is terminated.

FIG. 7D A diagram showing potentials in the pixel of the CMOS image sensor shown in FIG. 2 in the conventional operation thereof when electric charge is transferred.

FIG. 13 A diagram showing a circuit configuration of a pixel (unit pixel) used in a CMOS image sensor.

FIG. 14 A diagram showing a potential configuration of the pixel shown in FIG. 13.

FIG. 15 A diagram showing an example of difference in the amount of electric charge to be accumulated in a photodiode occurring depending on the configuration of photographic recording sensitivity when obtaining an image by the same exposure.

DESCRIPTION OF EMBODIMENTS

The present invention will now be described in detail below with reference to the accompanying drawings showing embodiments thereof.

Figure 1:
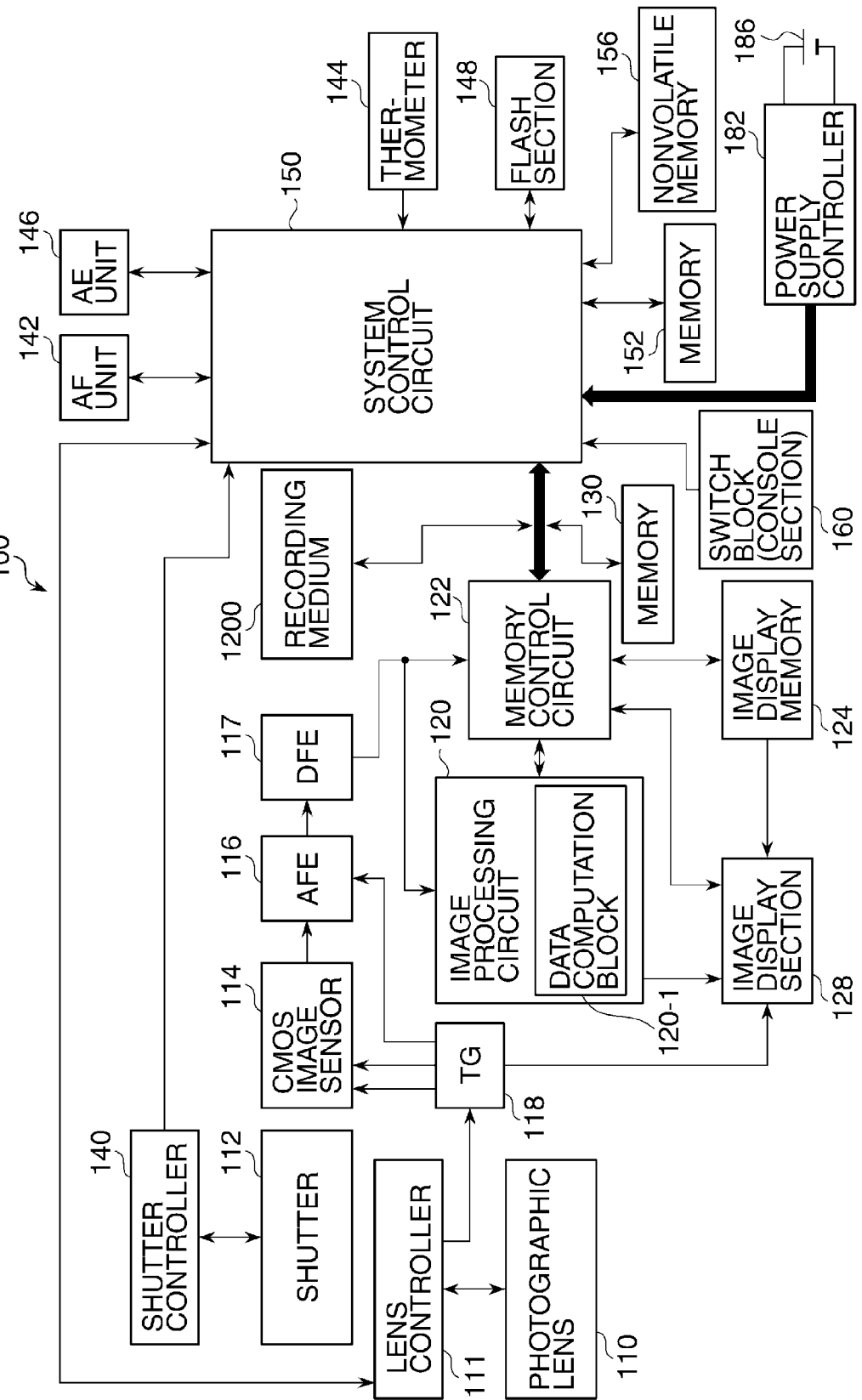
FIG. 1 A block diagram of an image pickup apparatus according to a first embodiment of the present invention.

FIG. 1 is a block diagram of an image pickup apparatus according to a first embodiment of the present invention, and the image pickup apparatus is a digital camera, for example.

In FIG. 1, the image pickup apparatus 100 has a photographic lens 110 mounted thereto, which is provided with a motor (not shown). Then, a lens controller 111 drives the motor according to a result of processing by an AF (Autofocus) unit 142, referred to hereinafter, to perform focusing. That is, the lens controller 111 controls the operation of the photographic lens 110. Further, the lens controller 111 transmits information on the photographic lens 110 to a system control circuit 150.

Although not shown, the lens controller 111 has a control signal generation section. In response to a pulse signal from the control signal generation section, the lens controller 111 carries out control of driving the motor to execute the focus adjustment operation and the like of the photographic lens 110.

Further, the image pickup apparatus 100 has a shutter 112, and the amount of exposure of a CMOS image sensor 114 is adjusted by the shutter 112. The shutter 112 is controlled by a shutter controller 140.

The CMOS image sensor 114 includes a plurality of pixels 60 illustrated by way of example in FIG. 13, which are arranged in a matrix form. Then, the CMOS image sensor 114 converts an optical input (i.e. optical image) from the photographic lens 110 into an electrical signal and outputs the converted electrical signal as an output voltage.

The configuration of the CMOS image sensor 114 will be described in detail hereinafter. Further, a low-pass filter (LPF: not shown) is disposed between the photographic lens 110 and the CMOS image sensor 114. The LPF cuts off unwanted wavelengths of light having passed through the photographic lens 110 (unnecessary wavelengths which would affect color reproduction).

As shown in FIG. 1, the output of the CMOS image sensor 114 is connected to an analog front-end circuit (hereinafter referred to as "the AFE") 116. The AFE 116 includes an A/D (Analog/digital) converter for converting an output voltage delivered from the CMOS image sensor 114 (hereinafter also referred to as "the analog signal") to a digital signal, a clamp circuit (offset adjustment circuit), and a D/A converter. The AFE 116 converts the analog signal to the digital signal, and outputs the converted digital signal.

The AFE 116 is connected to a digital front-end circuit (hereinafter referred to as "the DFE") 117. The DFE 117 receives the digital signal output from the AFE 116 (hereinafter also referred to as "the image data"), and performs digital processing, such as correction and rearrangement of the image data.

A timing generation circuit (hereinafter referred to as "the TG") 118 supplies a clock signal and a control signal to the above-mentioned CMOS image sensor 114, AFE 116, and DFE 117. The TG 118 is controlled by a memory control circuit 122 and the system control circuit 150 (a control signal line is not illustrated in FIG. 1).

An image processing circuit 120 performs predetermined pixel interpolation processing and color conversion processing on image data from the DFE 117 or image data from the memory control circuit 122. The image processing circuit 120 performs a predetermined computation on photographed image data, as required.

The memory control circuit 122 is configured to control the AFE 116, the DFE 117, the TG 118, the image processing circuit 120, an image display memory 124, and a memory 130.

The image data from the DFE 117 is written in the image display memory 124 and the memory 130 via the image processing circuit 120 and the memory control circuit 122, or directly via the memory control circuit 122.

The image processing circuit 120 performs correction on the output voltage delivered from the CMOS image sensor 114 according to correction data and the like stored in a memory 152, referred to hereinafter. That is, the image processing circuit 120 performs imaging by performing development processing including color conversion on a pixel-by-pixel basis. Further, the image processing circuit 120 in the illustrated example has a data computation block 120-1, and is capable of detecting focus and brightness according to image data by the data computation block 120-1.

Then, the system control circuit 150 transmits control information to the lens controller 111 based on values detected by the data computation block 120-1. This makes it possible to execute the focus adjustment operation of the photographic lens 110.

An image display section 128 is e.g. an LCD (Liquid Crystal Display) of a TFT (Thin Film Transistor) type, and when performing an EVF (Electronic View Finder) operation, an image is continuously displayed on the image display section 128. That is, a moving image is displayed on the image display section 128, whereby it is possible to confirm movement of an object.

The memory 130 is for storing photographed still images or moving images, and has an enough storage capacity to store a predetermined number of still images or a predetermined time period of moving images.

The image pickup apparatus 100 in the illustrated example further includes a range controller (hereinafter referred to as "the AF unit") 142, a thermometer (Temp) 144, a photometry controller 146 (hereinafter referred to as "the AE unit"), and a flash section 148. The AF unit 142 is e.g. a controller for performing AF (autofocus) processing by measuring a distance to the object.

The thermometer 144 is a temperature detection unit for measuring an ambient temperature in a photographing environment and temperature within the image pickup apparatus (e.g. temperature in the vicinity of the CMOS image sensor 114). The AE unit 146 is a photometric unit for performing AE (auto exposure) processing. However, in the present embodiment, when performing an EVF operation, the ranging and photometry operations are performed by using part of the output voltage (output signal) from the CMOS image sensor 114. Therefore, the AF unit 142 and the AE unit 146 are not used.

It should be noted that the AE unit 146 has a flash shooting function by cooperating with the flash section 148. The flash section (hereinafter referred to as "the strobe") 148 is used for photographing when it is dark, and has a light projecting function for projecting AF auxiliary light.

Usually, the strobe 148 is directly connected to an accessory shoe (not shown) which is fixedly mounted onto the image pickup apparatus 100. However, it is also possible to connect the strobe 148 positioned away from the image pickup apparatus 100 via a dedicated cable, depending on photographing conditions.

It is configured such that it is possible to determine whether the strobe 148 is connected directly to the accessory shoe or is connected via the dedicated cable or the like, by using part of a communication line of the accessory shoe.

The system control circuit 150 is configured to control the overall operation of the image pickup apparatus 100, and incorporates a CPU (Central Processing Unit: not shown) and the like.

The memory 152 stores constants, variables, programs, and so forth for the operation of the system control circuit 150, and shading correction data and the like set in advance are stored in the memory 152.

It should be noted that according to execution of programs in the system control circuit 150, an operating state thereof, a message, etc. are displayed on a display section, not shown. Further, a nonvolatile memory 156 stores programs and the like, referred to hereinafter. The nonvolatile memory 156 is e.g. an EEPROM (Electrically Erasable Programmable Read Only Memory) which is electrically erasable and recordable.

Instructions are input from a switch block (console section) 160 to the system control circuit 150. Although not shown, the switch block 160 has a main switch (start switch), a shutter switch, a mode setting dial, and so forth. The main switch is used for inputting various kinds of operating instructions to the system control circuit 150. Further, the mode setting dial is used for switching a photographing mode and the like.

More specifically, the shutter switch has e.g. first and second switches (SW1 and SW2), which are turned ON in a stepwise manner by being depressed. In a first stage where the first switch is on, the operations of AF processing, AE processing, AWB (auto white balance) processing, EF (pre-Emission of Flash) processing, etc. are executed.

Further, in a second stage where the second switch is on, control of the shutter 112 and the like is carried out. Then, the output signal delivered from the CMOS image sensor 114 is written in the memory 130 as image data via the AFE 116, the DFE 117, and the memory control circuit 122 (exposure processing).

Further, in the second stage, development processing is performed by computation in the image processing circuit 120 and the memory control circuit 122, and image data is read out from the memory 130 so as to be compressed and written in a recording medium 1200 (recording processing). The shutter switch is used for starting the operation of the above-mentioned series of processing.

Further, although not shown, the switch block 160 has not only the above-mentioned switches and dial, but also an ISO sensitivity-setting switch, an EVF operation switch, a single shooting/continuous shooting switch, a continuous ranging operation-setting switch, a power switch, etc.

The ISO sensitivity-setting switch is for setting photographic recording sensitivity (ISO sensitivity), and the EVF operation switch is for continuously displaying an object (i.e. displaying a moving image) on the image display section 128.

The mode-setting dial serves as a photographing mode-setting unit for switching between various kinds of photographing modes (an automatic photographing mode, a program photographing mode, a shutter speed-priority photographing mode, an aperture-priority photographing mode, a manual photographing mode, a night view photographing mode, an astronomical photographing mode, a portrait photographing mode, etc.).

The single shooting/continuous shooting switch is for switching shooting, i.e. photographing between single shooting and continuous shooting, and the continuous ranging operation-setting switch is for continuously repeating the AF processing and the lens focusing operation (usually, the ranging operation is carried out only once). Then, the power switch is for supplying power to the image pickup apparatus 100.

A power supply controller 182 is provided with e.g. a battery detection circuit and a DC-DC converter (neither of which is shown), and a power section 186 is connected to the power supply controller 182. The power section 186 is e.g. a primary battery, such as an alkaline battery or a lithium battery, a secondary battery such as a NiCd battery, a NiMH battery, or a Li battery, or an AC adapter.

The recording medium 1200 is a memory card, a hard disk, or the like, and can be mounted and removed to and from the image pickup apparatus 100.

Figure 2:
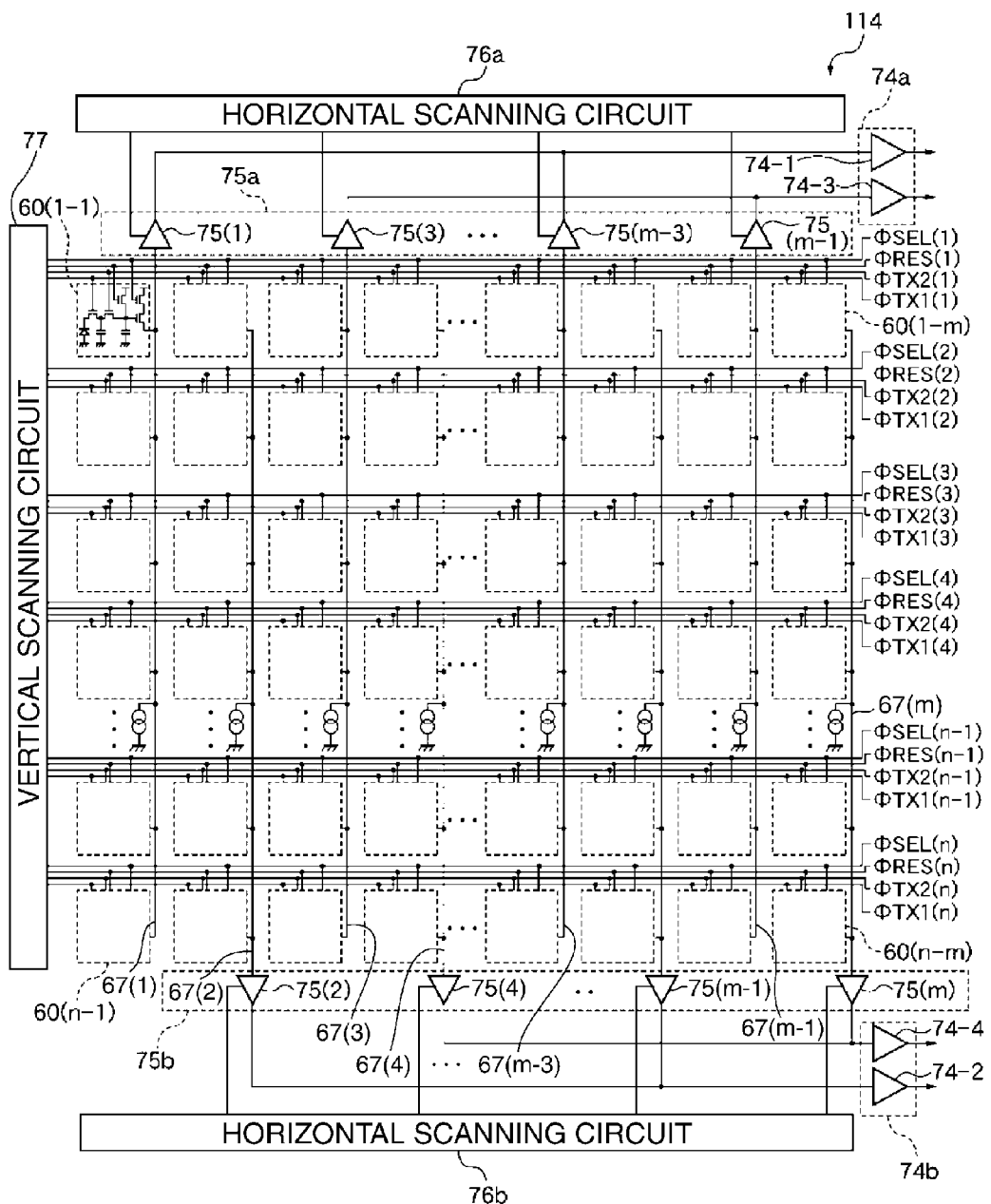
FIG. 2 A diagram showing a layout of a CMOS image sensor appearing in FIG. 1.

FIG. 2 is a diagram showing a layout of the CMOS image sensor 114 appearing in FIG. 1. In FIG. 2, the CMOS image sensor 114 has a plurality of pixels 60 (image pickup elements). The configuration of each pixel 60 is described hereinabove with reference to FIG. 13, and hence description thereof is omitted.

In the CMOS image sensor 114, the plurality of pixels 60 are arranged in a matrix form. In the illustrated example, pixels 60 (1-1) to 60 (n-m) are arranged in a matrix form (wherein, n represents an integer not less than 1, and m represents an integer not less than 1).

The charge accumulation control in the pixels 60 (1-1) to 60 (n-m) is carried out by control signals from a vertical scanning circuit 77. In FIG. 2, a control signal for controlling the first transfer transistor 62 (first transfer switch) in the pixel 60 shown in FIG. 13 is referred to as a first transfer control signal φTX1.

Further, a control signal for controlling the second transfer transistor 69 is referred to as a second transfer control signal φTX2. Then, a control signal for controlling the reset transistor 63 is referred to as a reset control signal φRES, and a control signal for controlling the row selection transistor 66 is referred to as a row selection control signal φSEL.

As shown in FIG. 2, the CMOS image sensor 114 has vertical output lines 67 (1) to 67 (m). The numeral in parentheses represents a line number. Each of the vertical output lines 67 (1) to 67 (m) is common to pixels aligned in a line in a vertical direction (i.e. a column direction), and is connected to an associated one of S-N circuits 75 (1) to 75 (m). That is, an S-N circuit is provided for each vertical output line.

The odd-numbered S-N circuits 75 (1) to 75 (m-1) are connected to a horizontal scanning circuit 76a, and the even-numbered S-N circuits 75 (2) to 75 (m) are connected to a horizontal scanning circuit 76b. Then, the horizontal scanning circuits 76a and 76b perform output selection control of these S-N circuits 75 (1) to 75 (m).

The outputs of the S-N circuits 75 (1) to 75 (m) are, as shown in FIG. 2, connected to output amplifiers 74-1 to 74-4 which perform output amplification associated with a desired photographic recording sensitivity (ISO sensitivity), and deliver the amplified output to the AFE 116 in a later stage (FIG. 1). A desired ISO sensitivity is set based on ISO 100. For ISO 200, the output voltage output from the pixels is amplified to twice its original level, and for ISO 400, the output voltage output from the pixels is amplified to four times its original level.

Figure 3:
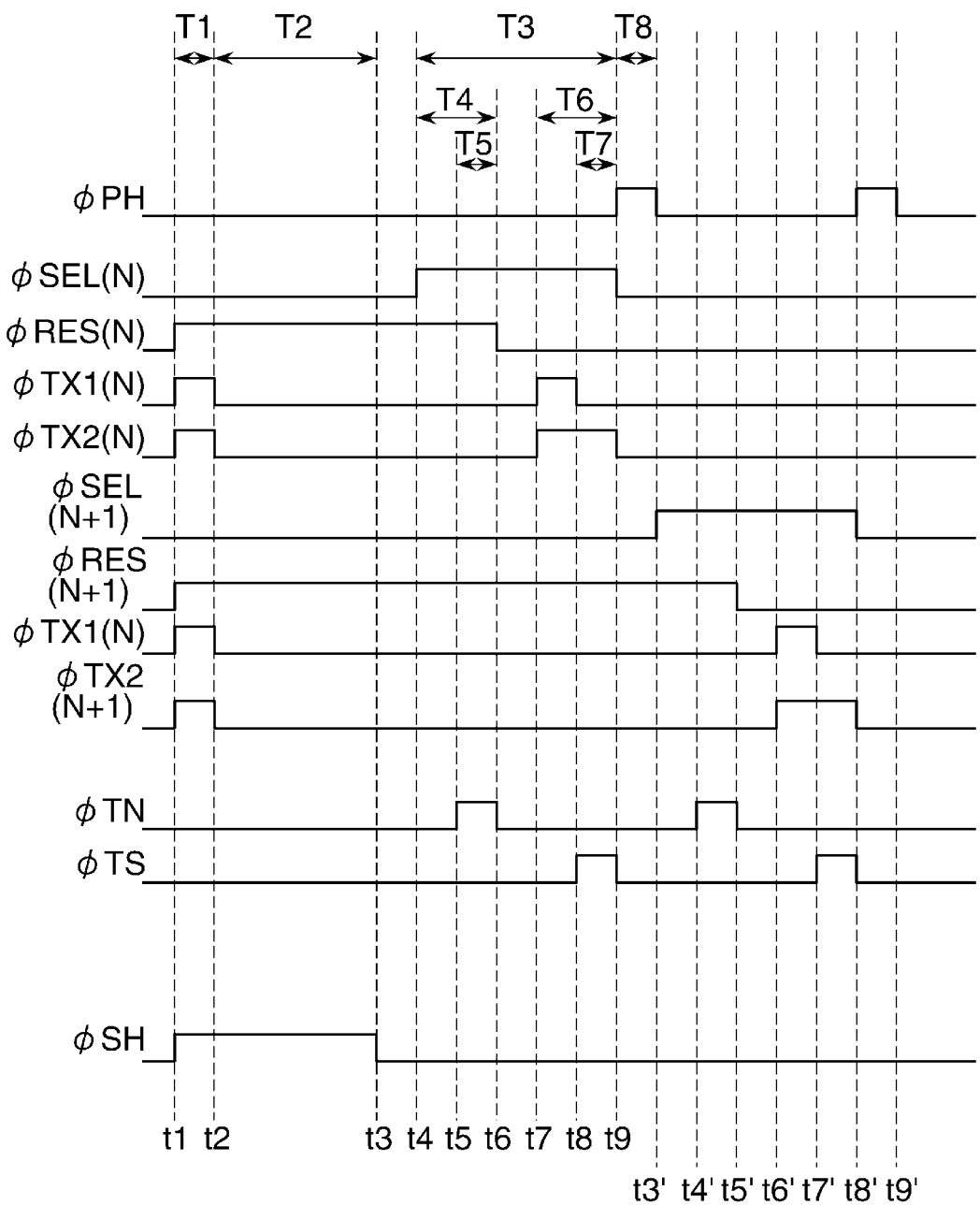
FIG. 3 A timing diagram useful in explaining the operation of the CMOS image sensor shown in FIG. 2 in a first operation mode thereof.

FIG. 3 is a timing diagram useful in explaining the operation of the CMOS image sensor shown in FIG. 2 in a first operation mode thereof. FIGS. 4A to 4D are diagrams showing potentials in a pixel of the CMOS image sensor shown in FIG. 2 in the first operation mode thereof.

Referring not only to FIGS. 2 to 4D but also to FIG. 13, first, at the timing of a time t1 as the start of a time period T1 for resetting all of the pixels 60(1-1) to 60(n-m), the vertical scanning circuit 77 activates the first transfer control signals φTX1(N) to φTX1(N+X), the second transfer control signals φTX2(N) to φTX2(N+X), and the reset control signals φRES (N) to φRES(N+X). It should be noted that a shutter control signal pSH supplied to the shutter 112 from the shutter control circuit 140 under the control of the system control circuit 150 continues to be activated from the time t1 through a time t3 to hold the shutter 112 open.

In the illustrated example, N represents one of the integers from 1 to n, and similarly, X represents an integer not less than 0, provided that N+X is not larger than n. The numerals in parentheses of the above-mentioned control signals each represent a row number. That is, (N+X) represents the (N+X)-th row, and the first transfer control signal φTX1(N+X) represents the first transfer control signal φTX1 applied to the pixels 60 arranged in the (N+X)th row. The second transfer control signal φTX2 and the reset control signal φRES are similar to the case of the first transfer control signal φTX1. In FIG. 3, only a case of X=0, 1 is illustrated.

As a consequence, in each of all of the pixels 60(1-1) to 60(n-m), the PD 61, the MEM 68, and the FD 64 are connected, whereby the potential of the PD 61 is made equal to the reset potential via the reset transistor 63. The PD 61 is thus reset.

At this time, the shutter 112 is held open as mentioned above for introducing an optical input to the pixels, and simultaneously when the time period T1 is terminated, accumulation of electric charge in all of the pixels 60(1-1) to 60(n-m) is started. That is, at the timing of a time t2 as the start of a time period T2, the vertical scanning circuit 77 deactivates the first transfer control signals φTX1(N) to φTX1(N+X) and the second transfer control signals φTX2(N) to φTX2(N+X). The shutter 112 is controlled to be open throughout the time period T1 and the time period T2, and this time period T2 serves as a charge accumulation period of each PD 61.

During the charge accumulation period T2 as well, the vertical scanning circuit 77 keeps the reset control signal φRES(N) active. As a consequence, the reset transistor 63 of each pixel 60 arranged in the N-th row remains on, whereby each FD 64 is held at the reset potential. That is, the dark current noise accumulated in the FD 64 during the charge accumulation period is discharged to the reset potential side.

At the start of the charge accumulation period T2, the vertical scanning circuit 77 deactivates the first transfer control signal φTX1(N), as mentioned above, whereby the barrier TX1 is set. The potential of the PD 61 is configured such that if an amount of incoming light during this time period is so large that the amount of electric charge accumulated in the PD 61 exceeds the capacity thereof, excessive electric charge flows over the barrier TX1 into the MEM 68 (see FIG. 4B).

After the charge accumulation period T2 expires, the shutter control signal φSH is deactivated to close the shutter 112 at the timing of a time t3, whereby the charge accumulation in the PD 61 is terminated. In this state, the PD 61 has the electric charge accumulated therein. That is, when the charge accumulation is terminated, the electric charge generated by the optical input except electric charge overflowed to the MEM 68 and the dark current noise generated therein during the charge accumulation time are accumulated in the PD 61.

Further, the MEM 68 is in a state storing the overflowed electric charge which has exceeded the barrier TX1 and the dark current noise generated therein during the charge accumulation. It should be noted that at this stage, the reset control signal φRES(N) has been kept active to hold the reset transistor 63 on, so that the dark current noise is discharged therefrom to hold the FD 64 at the reset potential (see FIG. 4C).

Subsequently, from the timing of a time t4, a reading operation is started for each line. That is, the operation of sequentially reading out the pixels in each row, i.e. first, the pixels in the (N)-th row, then, the pixels in the (N+1)-th row, next, the pixels in the (N+2)-th row, et seq. is performed.

More specifically, at the start of a time period T3 for reading which corresponds to the N-th row in the illustrated example, the vertical scanning circuit 77 activates the row selection control signal φSEL(N), and holds it active during the time period T3. As a consequence, the row selection transistor 66 of each pixel 60 arranged in the N-th row is turned on, whereby in each pixel 60 arranged in the N-th row, the source follower circuit formed by the amplifier transistor 65 is held in the operating state.

Here, the vertical scanning circuit 77 continues to activate the reset control signal φRES(N) also in a time period T4 indicated in FIG. 3. As a result, the reset transistor 63 is kept on, and the FD 64 is kept initialized, that is, a dark-level signal is output to the vertical output line 67.

Subsequently, in a time period T5, a control signal φTN input from each of the horizontal scanning circuits 76a and 76b to the S-N circuits 75(1) to 75(m) is activated. As a consequence, the dark-level signal, which is indicative of a dark level caused by resetting of each FD 64, is output from the FD 64 to a dark-level signal holding section (not shown) of an associated one of the S-N circuits 75(1) to 75(m) via the associated vertical output line 67. This operation is simultaneously executed in parallel with respect to all of the pixels arranged in the N-th row. The time period T5 during which the dark-level signals are output to the S-N circuits 75(1) to 75(m) is referred to as "the N reading" time period.

When the transfer of the above-mentioned dark-level signal (N reading) is terminated, the vertical scanning circuit 77 activates the first transfer control signal φTX1(N) and the second transfer control signal φTX2(N) at the timing of a time t7. This turns on the first transfer transistor 62 and the second transfer transistor 69, whereby the electric charge accumulated in the PD 61 is transferred to the FD 64.

The vertical scanning circuit 77 sets the first transfer control signal φTX1(N) back to the deactivated state at the timing of a time t8. On the other hand, the vertical scanning circuit 77 maintains the second transfer control signal φTX2(N) in the active state during a time period T6. At this time, a control signal φTS input from each of the horizontal scanning circuits 76a and 76b to the S-N circuits 75(1) to 75(m) is activated during a time period T7.

That is, the electric charge accumulated in the PD 61 [optical charge (optical charge which has been accumulated but not overflowed)+dark current noise generated therein] and the electric charge accumulated in the MEM 68 [optical charge (charge overflowed from the PD61)+dark current noise generated therein] are transferred to the FD 64 as the accumulated charge (see FIG. 4D). At this time, in the FD 64, the potential is changed from the reset level by an amount commensurate with the transferred charge, whereby the signal level is finally determined. Then, a signal-level signal indicative of the signal level is output from the FD 64 to a signal-level signal holding section of an associated one of the S-N circuits 75(1) to 75(m) via the associated vertical output line 67.

The time period T6 during which the signal-level signals are output to the S-N circuits 75(1) to 75(m) is referred to as "the S reading" time period. Further, the combination of the above-mentioned "N reading" time period and "S reading" time period is generally referred to as "the horizontal blanking time" (HBLK) (actually, the horizontal blanking time includes a time to wait for transition from one operation ("N reading") to the other ("S reading")).

When the operation in the above-mentioned horizontal blanking time is terminated, the dark-level signal and the signal-level signal are held in the dark-level signal and signal-level signal holding sections of each of the S-N circuits 75(1) to 75(m), respectively. That is, the dark-level signal and signal-level signal holding sections of each S-N circuit 75 hold the respective dark level and signal level of an associated one of the pixels arranged in the N-th row.

Then, by determining a difference between the dark level and the signal level of each pixel 60, it is possible to obtain the output voltage in which fixed pattern noise (FPN) due to variation in a threshold voltage Vth of the source follower circuit and KTC noise (reset noise) generated when resetting the reset transistor 63 are canceled out.

It should be noted that the dark current noises generated in the PD 61 and the MEM 68 during the charge accumulation time are contained in the above-mentioned output voltage.

Then, the horizontal scanning circuits 76a and 76b horizontally scan difference signals each indicative of the difference between the dark level and the signal level held in the respective dark-level signal and signal-level signal holding sections of the associated one of the S-N circuits 75(1) to 75(m) and output the scanned difference signals during a time period T8 in time series. This completes the operation of reading from the pixels in the N-th row. It should be noted that a control signal OH output from the horizontal scanning circuits 76a and 76b to the S-N circuits 75(1) to 75(m) is activated during the time period T8 for the horizontal scan.

Similarly, the operation of reading from the pixels in the (N+1)-th line is performed. That is, the vertical scanning circuit 77 drives the row selection control signal φSEL(N+1), the reset control signal φRES(N+1), the first transfer control signal φTX1(N+1), the second transfer control signal φTX2(N+1), and the control signals φTN and φTS, similarly to the driving of the pixels in the N-th row, to thereby perform reading from the pixels in the (N+1)-th line.

Here, a mode related to the above-mentioned reading operation is referred to as a first operation mode. In the first operation mode, the electric charge overflowing from the PD 61 is accumulated in the MEM 68. Therefore, the dark current noise in the MEM 68 is also contained in the electric charge. For this reason, although the dark current noise becomes large, compared with the case where the MEM 68 is not provided, since the dynamic range of the PD 61 is expanded, it is effective in acquiring an image requiring excellent gradation.

That is, in the case of the low photographic sensitivity recording in which electric charge accumulated in the PD 61 is large and the gain ratio in the later stage than the pixels is low, an amplification ratio of dark current noise also becomes low. Therefore, even if the dark current noise is large to some extent, the influence thereof on the image quality is small, and hence the first operation mode is effective in obtaining an image requiring excellent gradation.

Figure 5:
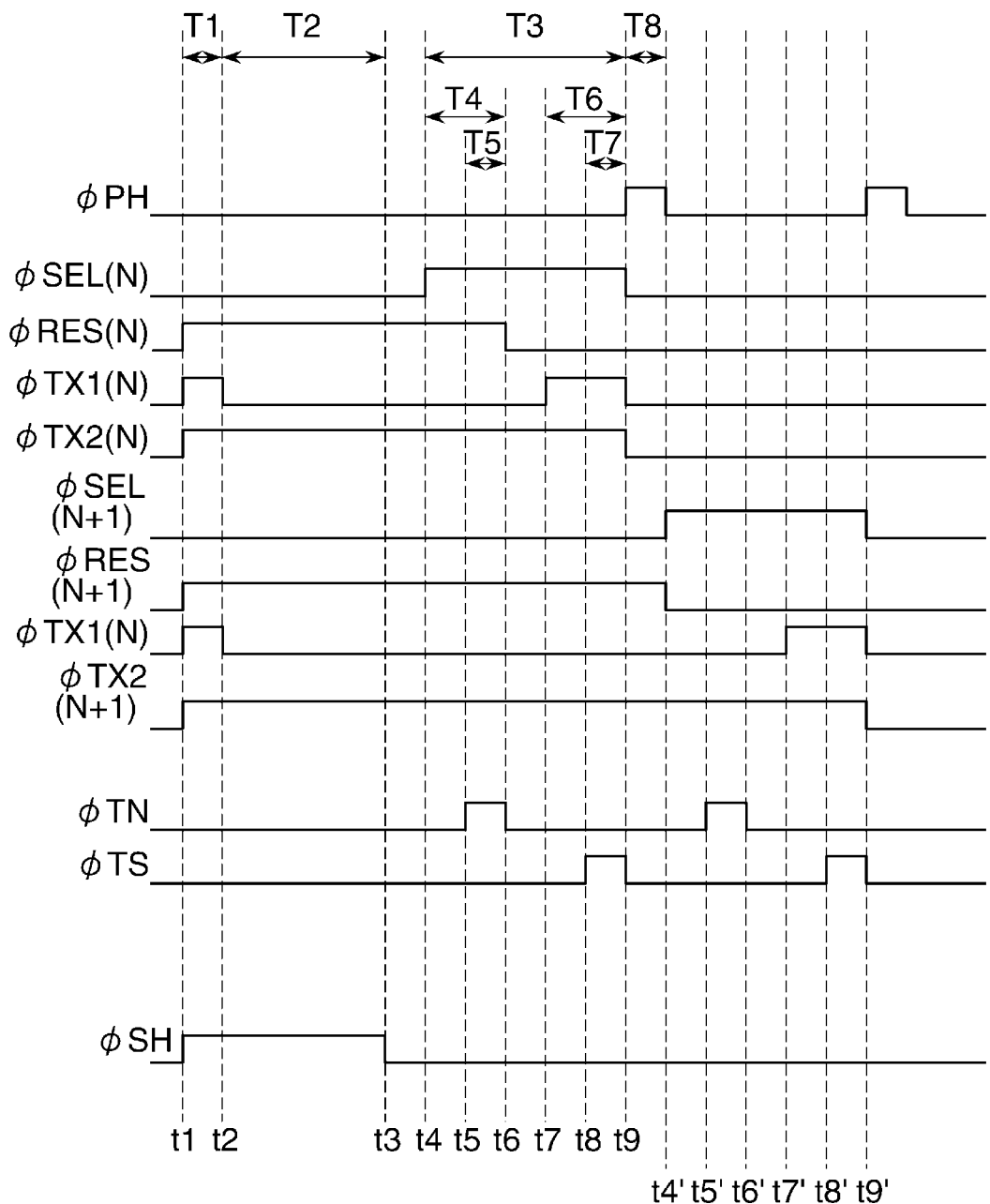
FIG. 5 A timing diagram useful in explaining the operation of the CMOS image sensor shown in FIG. 2 in a second operation mode thereof.

FIG. 5 is a timing diagram useful in explaining the operation of the CMOS image sensor 114 shown in FIG. 2 in a second operation mode thereof. FIGS. 6A to 6E are diagrams respectively showing potentials in the CMOS image sensor 114 shown in FIG. 2 in the second operation mode.

Referring to FIG. 13 in addition to FIGS. 2, 5, and 6A to 6E, at the timing of a time t1 as the start of a reset period T1 for resetting all pixels 60(1-1) to 60(n-m), the first transfer control signals φTX1(N) to φTX1(N+X), the second transfer control signals φTX2(N) to φTX2(N+X), and the reset control signals φRES(N) to φRES(N+X) are activated as described above. Further, the shutter control signal ϕSH supplied to the shutter 112 from the shutter control circuit 140 under the control of the system control circuit 150 continues to be activated from the time t1 through a time t3 to hold the shutter 112 open.

As a consequence, in all of the pixels 60(1-1) to 60(n-m), the PD 61, the MEM 68, and the FD 64 are connected, whereby the potential of the PD 61 is made equal to the reset potential via the reset transistor 63. The PD 61 is thus reset.

At this time, the shutter 112 is held open as mentioned above for introducing an optical input to the pixels, and simultaneously when the time period T1 is terminated, accumulation of electric charge in all of the pixels 60(1-1) to 60(n-m) is started. That is, at the timing of a time t2 as the start of a time period T2, the vertical scanning circuit 77 deactivates the first transfer control signals ϕTX1(N) to ϕTX1(N+X). The shutter 112 is controlled to be open throughout the time period T1 and the time period T2, and this time period T2 serves as a charge accumulation period of each PD 61, as mentioned hereinabove.

During the charge accumulation period T2 as well, the vertical scanning circuit 77 keeps the reset control signal ϕRES(N) and the second transfer control signal ϕTX2(N) active. As a consequence, the reset transistor 63 of each pixel 60 arranged in the N-th row remains on, whereby each FD 64 is held at the reset potential. That is, during the charge accumulation period, the dark current noise accumulated in the FD 64 and the dark current noise accumulated the MEM 68 are discharged to the reset potential side (see FIG. 6B).

At the start of the charge accumulation period T2, the vertical scanning circuit 77 deactivates the first transfer control signal ϕTX1(N), as mentioned above, whereby the barrier TX1 is set. The potential of the PD 61 is configured such that if an amount of incoming light during this time period is so large that the amount of electric charge accumulated in the PD 61 exceeds the capacity thereof, excessive electric charge flows over the barrier TX1 into the MEM 68 (see FIG. 6C).

After the charge accumulation period T2 expires, the shutter control signal ϕSH is deactivated to close the shutter 112 at the timing of a time t3, whereby the charge accumulation in the PD 61 is terminated. In this state, the PD 61 has the electric charge accumulated therein.

That is, when the charge accumulation is terminated, the electric charge generated by the optical input except electric charge overflowed to the MEM 68 and the dark current noise generated therein during the charge accumulation time are accumulated in the PD 61. Further, in this stage, the MEM 68 and the FD 64 are at the reset potential by keeping the reset control signal ϕRES(N) and the second transfer control signal ϕTX2(N) active so as to discharge the dark current noises generated therein (see FIG. 6D).

Subsequently, from the timing of a time t4, a reading operation is started for each line. That is, the operation of sequentially reading out the pixels in each row, i.e. first, the pixels in the (N)-th row, then, the pixels in the (N+1)-th row, next, the pixels in the (N+2)-th row, et seq. is performed.

More specifically, at the start of a time period T3 for reading which corresponds to the N-th row in the illustrated example, the vertical scanning circuit 77 activates the row selection control signal ϕSEL(N), and holds it active during the time period T3. As a consequence, the row selection transistor 66 of each pixel 60 arranged in the N-th row is turned on, whereby in each pixel 60 arranged in the N-th row, the source follower circuit formed by the amplifier transistor 65 is held in the operating state.

Here, the vertical scanning circuit 77 continues to activate the reset control signal ϕRES(N) also in a time period T4 indicated in FIG. 3. As a result, the reset transistor 63 is kept on, and the FD 64 is kept initialized, that is, a dark-level signal is output to the vertical output line 67.

Subsequently, in a time period T5, the control signal ϕTN is activated. As a consequence, the dark-level signal, which is indicative of a dark level caused by resetting of each FD 64, is output from the FD 64 to the dark-level signal holding section of the associated one of the S-N circuits 75(1) to 75(m) via the associated vertical output line 67 (that is, "the N reading" is performed).

When the transfer of the above-mentioned dark-level signal (N reading) is terminated, the vertical scanning circuit 77 activates the first transfer control signal ϕTX1(N) while keeping the second transfer control signal ϕTX2(N) active, at the timing of a time t7. This causes the first transfer transistor 62 and the second transfer transistor 69 to be on, whereby the electric charge accumulated in the PD 61 is transferred to the FD 64. That is, the "S reading" operation in which the signal charge (electric charge+dark current noise) accumulated in the PD 61 is transferred to the FD 64 is performed (see FIG. 6E).

At this time, in the FD 64, the potential is changed from the reset level by an amount commensurate with the transferred charge, whereby the signal level is finally determined. Then, the signal-level signal indicative of the signal level is output from the FD 64 to the signal-level signal holding section of the associated one of the S-N circuits 75(1) to 75(m) via the associated vertical output line 67.

When the operation in the above-mentioned horizontal blanking time is terminated, the dark-level signal and the signal-level signal are held in the dark-level signal and signal-level signal holding sections of each of the S-N circuits 75(1) to 75(m), respectively. That is, the dark-level signal and signal-level signal holding sections of each S-N circuit 75 hold the respective dark level and signal level of an associated one of the pixels arranged in the N-th row.

Then, by determining a difference between the dark level and the signal level of each pixel 60, it is possible to obtain the output voltage in which fixed pattern noise (FPN) due to variation in a threshold voltage Vth of the source follower circuit and KTC noise (reset noise) generated when resetting the reset transistor 63 are canceled out.

It should be noted that the dark current noises generated in the PD 61 during the charge accumulation time is contained in the above-mentioned output voltage, but the dark current noises generated in the MEM 68 during the charge accumulation time is not contained therein, because the dark current noises generated therein has been discharged by keeping the reset control signal ϕRES(N) and the second transfer control signal ϕTX2(N) active.

Then, the horizontal scanning circuits 76a and 76b horizontally scan difference signals each indicative of the difference between the dark level and the signal level held in the respective dark-level signal and signal-level signal holding sections of the associated one of the S-N circuits 75(1) to 75(m) and output the scanned difference signals during a time period T8 in time series. This completes the operation of reading from the pixels in the N-th row.

Similarly, the operation of reading from the pixels in the (N+1)-th line is performed. That is, the vertical scanning circuit 77 drives the row selection control signal ϕSEL(N+1), the reset control signal ϕRES(N+1), the first transfer control signal ϕTX1(N+1), the second transfer control signal ϕTX2 (N+1), and the control signals ϕTN and ϕTS, similarly to the driving of the pixels in the N-th row, to thereby perform reading from the pixels in the (N+1)-th line.

Here, a mode related to the above-mentioned reading operation is referred to as a second operation mode. In the second operation mode, the MEM 68 is set to the reset potential during the charge accumulation period. Therefore, it is not possible to hold the electric charge overflowing from the PD 61. As a consequence, although the dynamic range is not expanded yet, it is possible to discharge the dark current noise during the charge accumulation period to the reset potential side, and hence it is effective for noise reduction.

That is, in the case of the high photographic sensitivity recording in which electric charge accumulated in the PD 61 is small and the gain ratio in the later stage than the pixels is high, there is a low possibility that the electric charge generated by optical input exceeds the capacity of charge accumulation in the PD 61. Therefore, considering that the dark current noise component is multiplied by the gain in the later stage than the pixels, to reduce the number of sites where dark current noise is generated is effective for high photographic sensitivity recording.

Now, FIGS. 7A to 7D respectively show an example of potentials in the pixel of the CMOS image sensor shown in FIG. 2 in a conventional operation thereof.

In FIGS. 7A to 7D, when resetting each pixel 60, the first and second transfer transistors 62 and 69 (FIG. 13) are turned on to thereby remove the barriers TX1 and TX2, whereby electric charge is transferred to the FD 64 and discharged to the reset potential side (see FIG. 7A).

During charge accumulation, while keeping the first transfer transistor 62 on to thereby maintain a state where the barrier TX1 is removed, the second transfer transistor 69 is turned on to thereby set the barrier TX2, whereby electric charge is accumulated in the MEM 68 (see FIG. 7B). Then, when the charge accumulation is terminated, the first transfer transistor 62 is turned off, so that the electric charge is held in the MEM 68 by the barriers TX1 and TX2 (see FIG. 7C).

Subsequently, the second transfer transistor 69 is turned on, whereby the barrier TX2 is removed. As a result, the electric charge is transferred from the MEM 68 to the FD 64 (see FIG. 7D).

In FIGS. 7A to 7D, the barrier TX1 is removed during the charge accumulation, whereby the electric charge is accumulated in the PD 61 is always transferred to the MEM 68.

Figure 8:
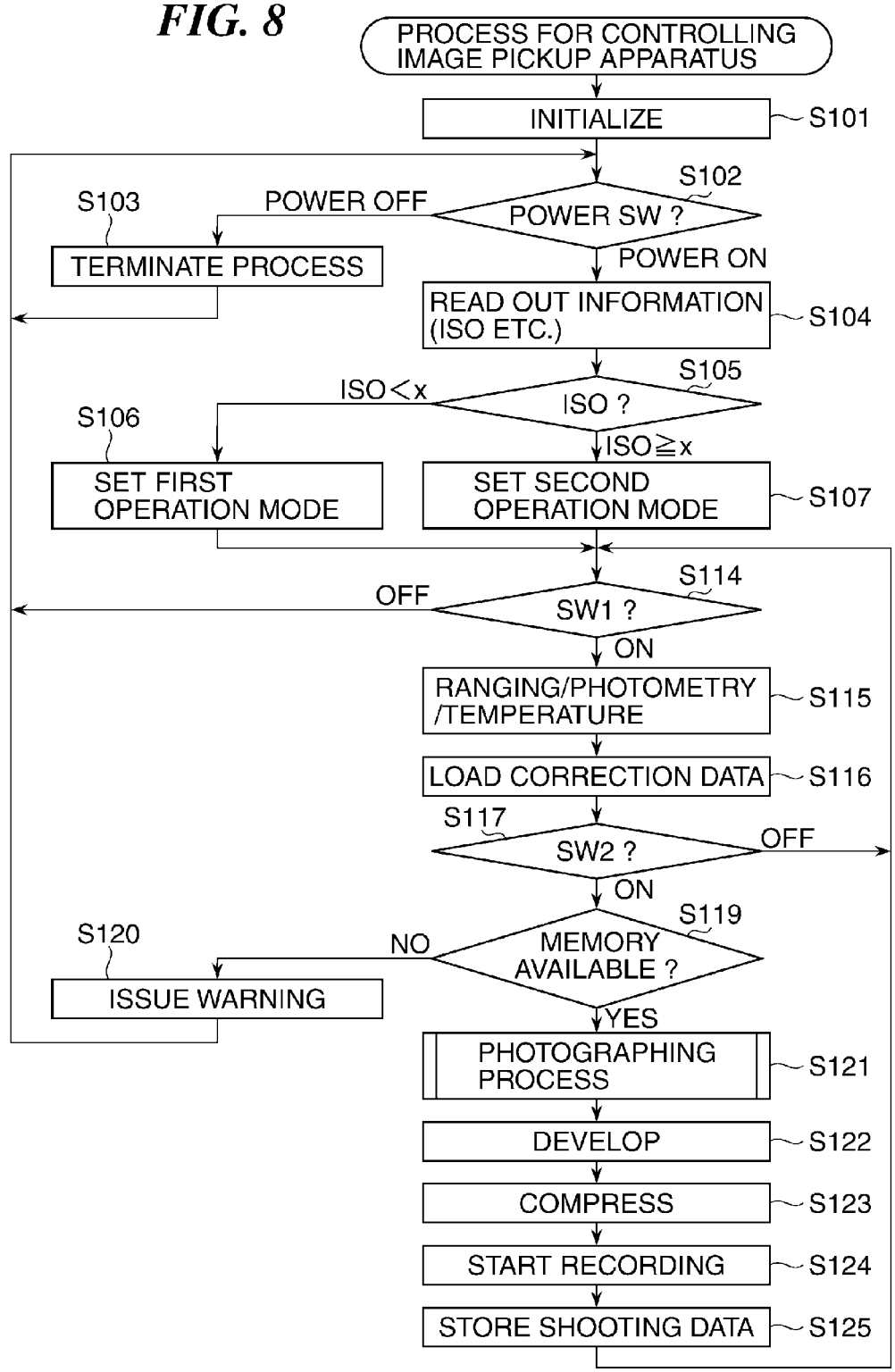
FIG. 8 A flowchart of a process for controlling the image pickup apparatus according to the first embodiment.

Next, a description will be given of the operation of the image pickup apparatus illustrated in FIG. 1. FIG. 8 is a flowchart of a process for controlling the image pickup apparatus 100 according to the first embodiment.

Referring to FIGS. 1 and 8, first, when the image pickup apparatus 100 is powered on, the system control circuit 150 initializes flags and control variables to perform necessary predetermined initializations of the sections associated with image processing (step S101).

Subsequently, the system control circuit 150 determines a set position of the main switch (power SW) of the switch block 160 to thereby determine whether or not the main switch is set to off (power off) (step S102).

If it is determined that the main switch is set to off (power off in the step S102), the system control circuit 150 changes display of each display section to a terminated state. Further, the system control circuit 150 records necessary parameters including flags and control variables, settings, and a set mode in the nonvolatile memory 156.

Then, the system control circuit 150 performs predetermined termination processing, such as shutting down of unnecessary power of each section related to the image processing, including the image display section 128, by the power supply controller 182 (termination processing: step S103). Thereafter, the system control circuit 150 returns to the step S102.

If it is determined that the main switch is set to on (power on in the step S102), the system control circuit 150 performs reading out of set configuration information, including the ISO sensitivity (step S104).

Then, the system control circuit 150 compares between the preset ISO sensitivity and a predetermined value (preset photographic recording sensitivity) "x" (step S105). Then, if the preset ISO sensitivity is a low photographic recording sensitivity lower than the predetermined value "x" (ISO<x in the step S105), the system control circuit 150 sets the operation mode of the CMOS image sensor 114 to the first operation mode (step S106).

That is, if the preset ISO sensitivity is lower than the predetermined value "x", the system control circuit 150 determines that the preset ISO sensitivity is low. In this case, there is a high possibility that it is necessary to expand the dynamic range of the PD 61 to cope with a large optical input (FIG. 13). Therefore, the system control circuit 150 causes sets the operation mode of the CMOS image sensor 114 to the first operation mode, described hereinabove with reference to FIGS. 3 and 4A to 4D, in which it is possible to expand the dynamic range.

On the other hand, if the preset ISO sensitivity is not lower than the predetermined value "x" (not lower than the preset photographic recording sensitivity) (ISO≥x in the step S105), the system control circuit 150 sets the operation mode of the CMOS image sensor 114 to the second operation mode (step S107).

That is, if the preset ISO sensitivity is not lower than the predetermined value "x", the system control circuit 150 determines that the preset ISO sensitivity is high. In this case, the optical input is small, and there is a sufficient dynamic range margin for the PD 61 (FIG. 13). However, the amount of generation of dark current noise is large e.g. due to long second shooting or the like and at the same time the dark current noise becomes noticeable by amplification in the later stage. For this reason, the system control circuit 150 sets the operation mode of the CMOS image sensor 114 to the second operation mode, described hereinabove with reference to FIGS. 5 and 6A to 6E, in which it is possible to suppress the dark current noise.

As described above, in the step S106 or S107, the system control circuit 150 switches the operation mode of the CMOS image sensor 114 according to the setting of the ISO sensitivity (i.e. gain).

Next, the system control circuit 150 determines whether or not the shutter switch SW1 is depressed (step S114). If the shutter switch SW1 is not depressed (OFF in the step S114), the system control circuit 150 returns to the step S102.

On the other hand, if the shutter switch SW1 is depressed (ON in the step S114), the system control circuit 150 performs ranging, photometry and temperature measurement (step S115).

That is, in the step S115, the system control circuit 150 performs ranging/photometry processing for performing ranging processing to focus the photographic lens 110 on the object, and performing photometry processing to determine an aperture value and a shutter speed, as described with reference to FIG. 1. It should be noted that in the photometry processing, setting of the flash is performed, as required. Further, the system control circuit 150 measures temperature by the thermometer 144 and stores the measured temperature in a predetermined area of the memory 152.

Then, the system control circuit 150 reads out various kinds of correction values (e.g. horizontal and vertical shading correction data), stored in advance, from the nonvolatile memory 156, and loads the correction values into a predetermined area of the memory 130 (correction data expansion: step S116).

Thereafter, the system control circuit 150 determines whether or not the shutter switch SW2 is depressed (step S117). If the shutter switch SW2 is not depressed (OFF in the step S117), the system control circuit 150 returns to the step S114.

On the other hand, if the shutter switch SW2 is depressed (ON in the step S117), the system control circuit 150 determines whether or not the memory 130 has an image storing buffer area which can store photographed image data (step S119).

Then, if it is determined that the memory 130 does not have an image storing buffer area which can store new image data (NO to the step S119), the system control circuit 150 displays an image on the image display section 128 or outputs sound to a display/sound section (not shown) to perform a predetermined warning (step S120). Thereafter, the system control circuit 150 returns to the step S102.

On the other hand, if it is determined that of the memory 130 has an image storing buffer area which can store new image data (YES to the step S119), the system control circuit 150 reads out the electric charges accumulated for a predetermined time period from the CMOS image sensor 114 according to the operation mode set in the above-mentioned step S106 or S107.

Then, the system control circuit 150 writes the image data in the predetermined area of the memory 130 via the image processing circuit 120 and the memory control circuit 122 from the AFE 116, or directly via the memory control circuit 122 from the AFE 116 (step S121).

Hereinafter, this process is referred to as the photographing process. It should be noted that the photographing process in the step S121 will be described in further detail with reference to FIG. 9, referred to hereinafter.

Then, the system control circuit 150 reads out part of the image data written in the predetermined area of the memory 130 via the memory control circuit 122. Then, the system control circuit 150 performs WB (white balance) integral computation processing required to perform development processing.

The system control circuit 150 stores the result of computation in the internal memory thereof or the memory 152. The system control circuit 150 reads out the image data written in the predetermined area of the memory 130 using the memory control circuit 122, and, if required, the image processing circuit 120.

Using the result of the computation stored the internal memory of the system control circuit 150 or the memory 152, the system control circuit 150 performs various kinds of development processing including the AWB (auto white balance) processing, gamma conversion processing, and color conversion processing on the read image data (development: step S122).

It should be noted that in the above-mentioned development processing, correction computation processing is performed in combination, using the correction values loaded into the memory 152 in the step S116.

Subsequently, the system control circuit 150 reads out the image data written in the predetermined area of the memory 130 to perform image compression processing according to the set operation mode using a compression/expansion circuit (not shown) (step S123). Then, the system control circuit 150 writes the image data on which the sequence of processing operations has been performed in an available image area of the image storing buffer area of the memory 130.

Further, the system control circuit 150 reads out the image data stored in the image storing buffer area of the memory 130, and starts recording processing for writing the image data in the recording medium 1200 (step S124).

The recording start processing is executed on new image data on which the sequence of processing operations has been performed whenever the image data is written in an available image area of the image storing buffer area of the memory 130.

It should be noted that during writing of the image data in the recording medium 1200, the system control circuit 150 performs a recording medium writing operation-indicating operation e.g. by causing the display section (LED or the like: not shown) to blink, so as to indicate that it is during the writing operation.

Thereafter, the system control circuit 150 stores data of the operation mode in the photographing process (e.g. exposure time, shooting date and time) and the like in the memory 152 or the nonvolatile memory 156 (step S125). Then, the system control circuit 150 returns to the step S114. This completes the sequence of processing operations related to shooting.

Figure 9:
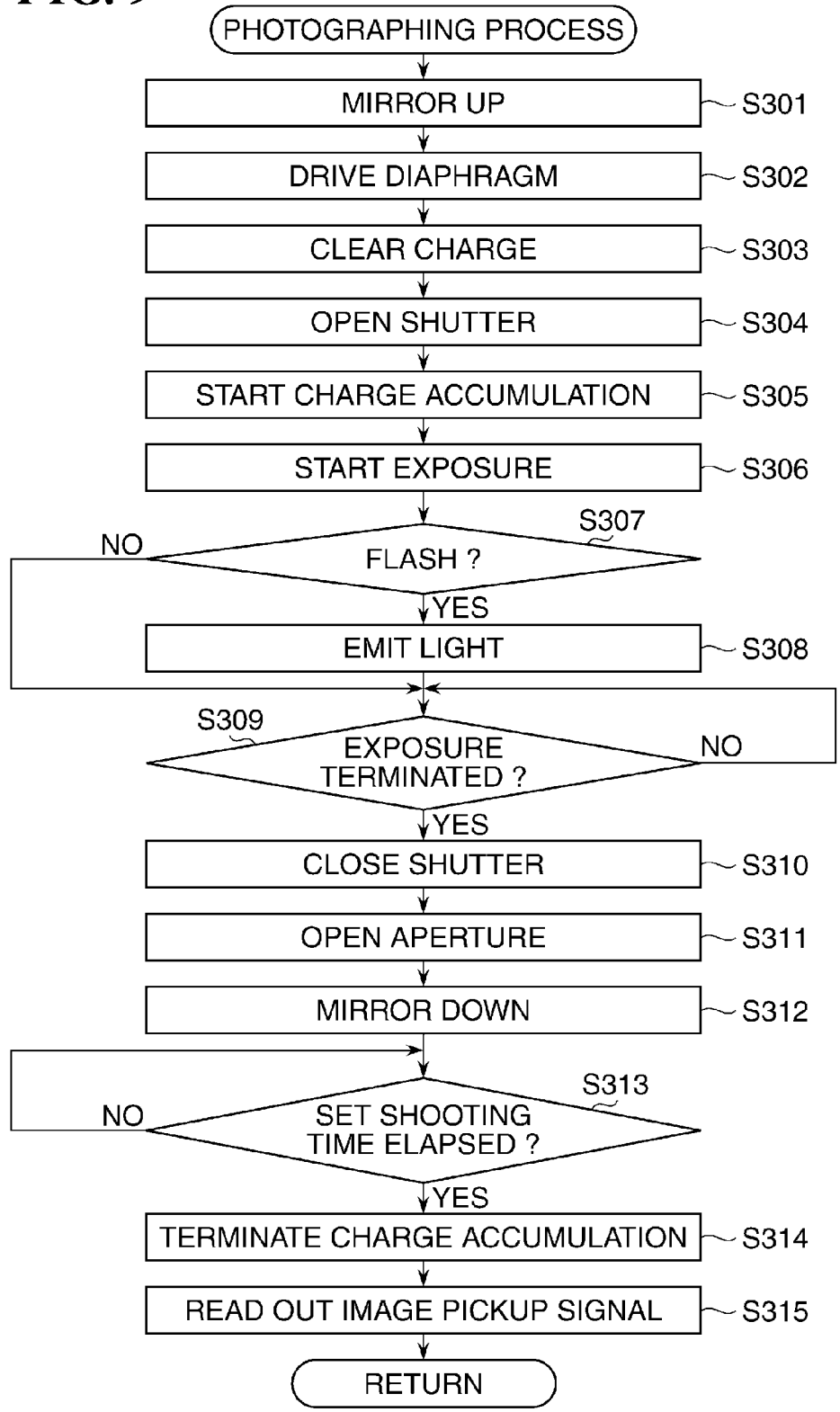
FIG. 9 A flowchart showing details of a photographing process in FIG. 8.

FIG. 9 is a flowchart showing details of the photographing process in the step S121 in FIG. 8.

Referring to FIGS. 1 and 9, in the photographing process in the step S121 in FIG. 8, first, the system control circuit 150 drives and controls a mirror (not shown) such that it is moved to a mirror up position (step S301). Then, the system control circuit 150 drives and controls a diaphragm (not shown) to a predetermined aperture value according to the photometry data stored in the internal memory of the system control circuit 150 or the memory 152 (step S302). Then, the charge clear operation (the charge reset operation) in the CMOS image sensor 114 is performed (step S303).

Subsequently, the system control circuit 150 opens the shutter 112 by the shutter controller 140 (step S304), and starts the charge accumulation in the CMOS image sensor 114 (step S305). Then, the system control circuit 150 starts exposure to the CMOS image sensor 114 (step S306).

Next, the system control circuit 150 determines whether or not the flash section 148 is required according to a flash flag (step S307). If it is determined that the flash section 148 is required (YES to the step S307), the system control circuit 150 executes control for causing the flash section 148 to emit light (step S308).

Next, the system control circuit 150 determines whether or not exposure to the CMOS image sensor 114 is terminated according to the photometry data (step S309). It should be noted that if it is determined that the flash section 148 is not required (NO to the step S307), the system control circuit 150 directly proceeds to the above-described step S309.

Then, when the exposure operation is terminated (YES to the step S309), the system control circuit 150 closes the shutter 112 by the shutter controller 140, and terminates exposure to the CMOS image sensor 114 (step S310). It should be noted that when the exposure operation is not terminated (NO to the step S309), the system control circuit 150 waits until the exposure operation is terminated.

Subsequently, the system control circuit 150 drives and controls the diaphragm to an open aperture value (step S311) and moves the mirror to the mirror down position (step S312).

Then, the system control circuit 150 determines whether or not the set charge accumulation time has elapsed (step S313). If the set charge accumulation time has elapsed (YES to the step S313), the system control circuit 150 sequentially terminates the charge accumulation in the CMOS image sensor 114 line by line (step S314).

Thereafter, the system control circuit 150 reads out the electric charge from each pixel 60 of the CMOS image sensor 114 as the output voltage (i.e. image pickup signal) (step S315). The output voltage is written in a predetermined area of the memory 130 as the image data via the image processing circuit 120 and the memory control circuit 122 from the AFE 116 or directly via the memory control circuit 122 from the AFE 116.

It should be noted that if the set charge accumulation time has not elapsed (NO to the step S313), the system control circuit 150 waits until the set charge accumulation time elapses. When the photographing process is thus terminated, the system control circuit 150 returns to the step S122 in FIG. 8.

Although in the above-described first embodiment, the operation mode of the CMOS image sensor 114 is determined according to the set photographic recording sensitivity (pre-set ISO sensitivity), in second and third embodiments of the present invention described hereafter, a description will be given of a process for controlling an image pickup apparatus, taking into account photographing conditions in which dark current noise is increased by other cause. It should be noted that in the following second and third embodiments, the hardware configuration and software configuration of the image pickup apparatus are the same as those of the image pickup apparatus according to the first embodiment, and hence component elements are denoted by the same reference numerals, while omitting the description thereof.

Figure 10A:
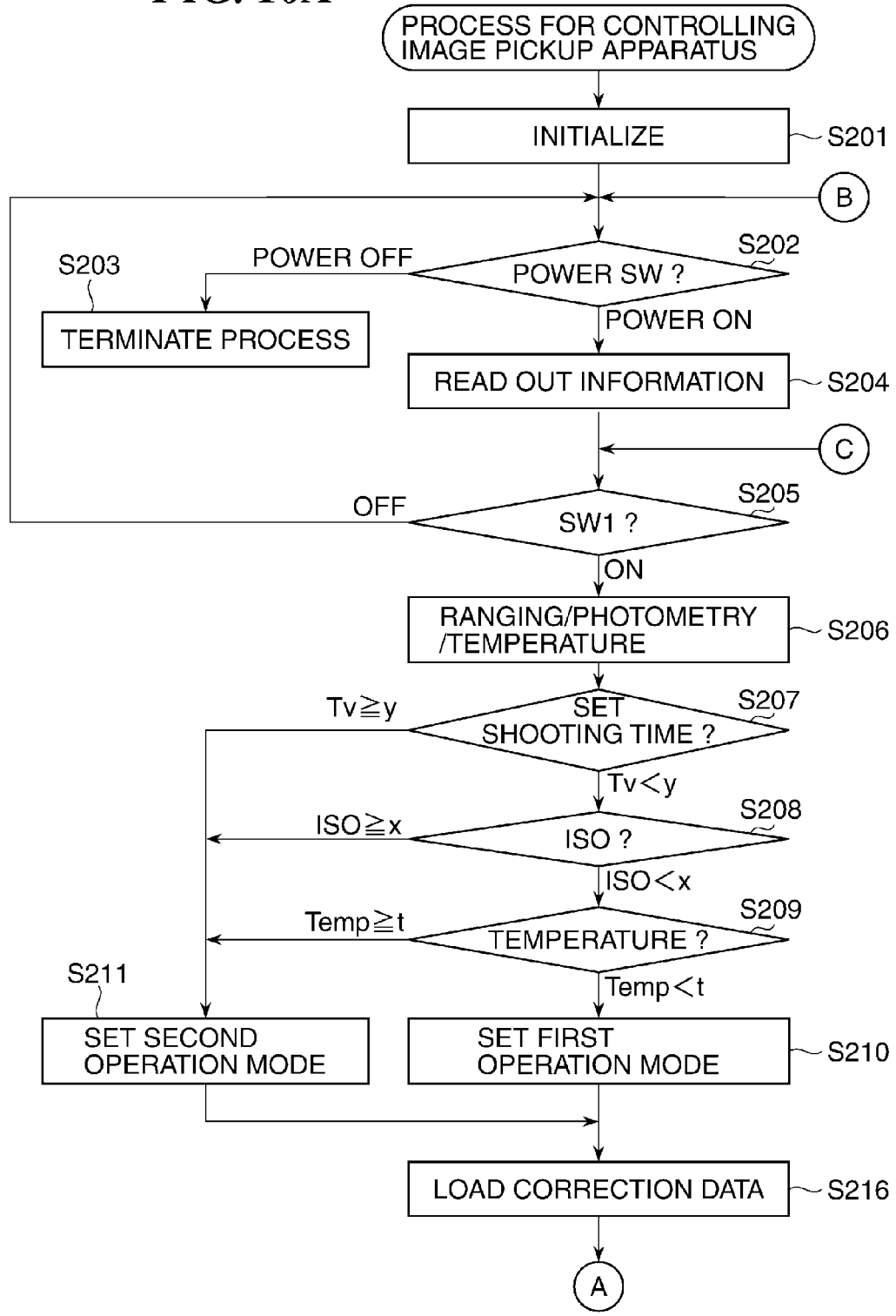
FIG. 10A A flowchart of a process for controlling an image pickup apparatus according to a second embodiment of the present invention.
Figure 10B:
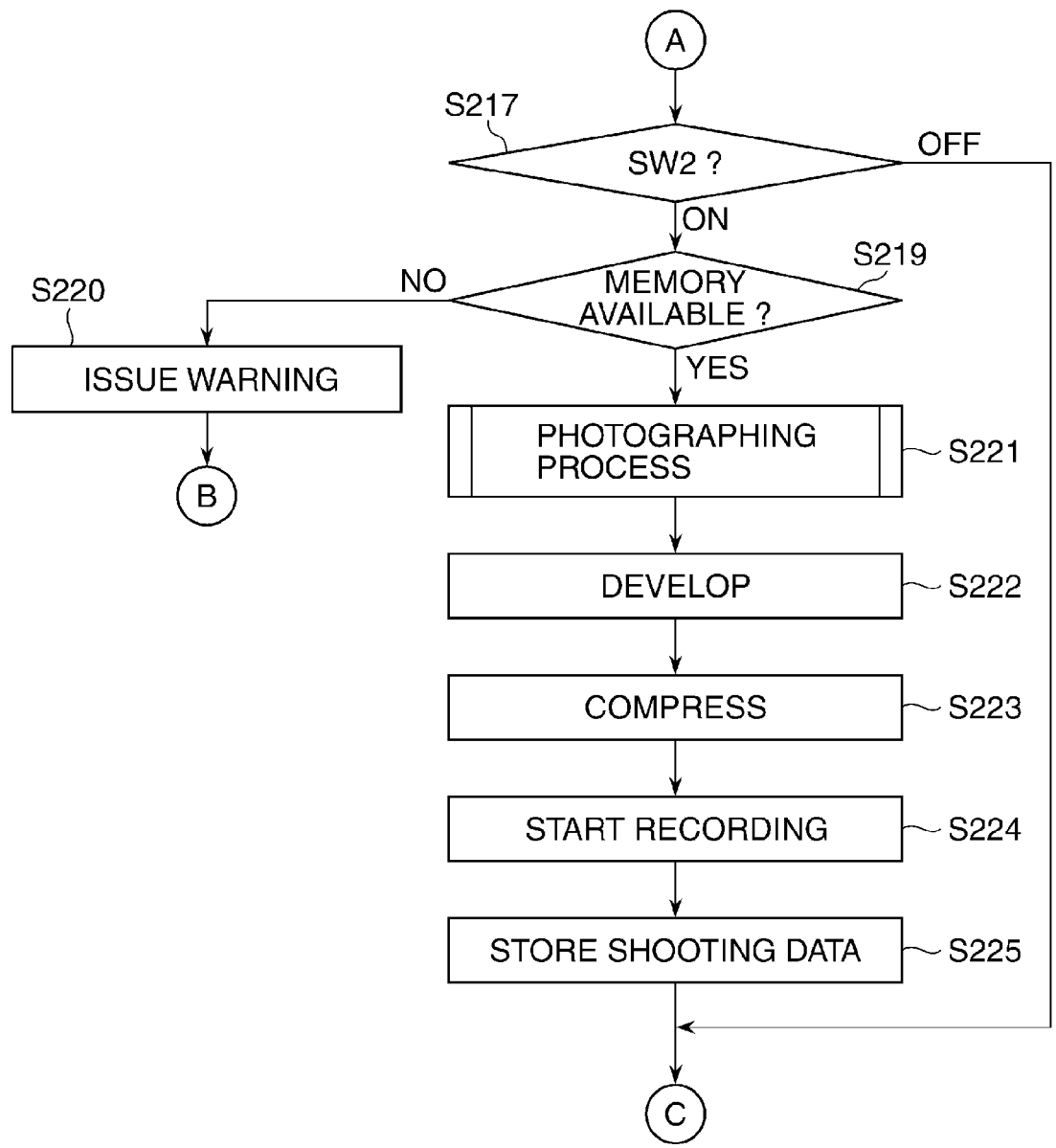
FIG. 10B A continuation of FIG. 10A.

FIGS. 10A and 10B are a flowchart of a process for controlling the image pickup apparatus 100 according to the second embodiment.

Referring to FIGS. 1, 10A, and 10B, first, when the image pickup apparatus 100 is powered on, the system control circuit 150 initializes flags, control variables, etc. to initialize the sections associated with image processing (step S201).

Subsequently, the system control circuit 150 determines a set position of the main switch (power SW) of the switch block 160 to thereby determine whether or not the main switch is set to off (power off) (step S202).

If it is determined that the main switch is set to off (power off in the step S202), the system control circuit 150 changes display of each display section to a terminated state. Further, the system control circuit 150 records necessary parameters including flags and control variables, settings, and a set mode in the nonvolatile memory 156.

Then, the system control circuit 150 performs predetermined termination processing, such as shutting down of the unnecessary power of each section related to image processing, including the image display section 128, by the power supply controller 182 (step S203). Thereafter, the system control circuit 150 returns to the step S202.

If it is determined that the main switch is set to on (power on in the step S202), the system control circuit 150 performs reading out of set configuration information, including the ISO sensitivity (step S204).

Thereafter, the system control circuit 150 determines whether or not the shutter switch SW1 is depressed (step S205). If the shutter switch SW1 is not depressed (OFF in the step S205), the system control circuit 150 returns to the step S202.

On the other hand, if the shutter switch SW1 is depressed (ON in the step S205), the system control circuit 150 performs ranging, photometry, and temperature measurement (step S206).

That is, in the step S206, the system control circuit 150 performs ranging/photometry processing for performing ranging processing to focus the photographic lens 110 on the object, and performing photometry processing to determine an aperture value and a shutter speed, as described hereinabove with reference to FIG. 1. It should be noted that in the photometry processing, setting of the flash is performed, as required. Further, the system control circuit 150 measures temperature by the thermometer 144 and stores the measured temperature in a predetermined area of the memory 152.

Then, the system control circuit 150 determines whether or not shooting time Tv set in the step S206 is not less than a predetermined value "y" (i.e. not less than the preset shooting time: not less than a time period determined in advance; hence, in other words, the shutter speed is not more than a predetermined value) (step S207).

If the shooting time Tv is a long time period not less than the preset shooting time y (Tv≥y in the step S207), the system control circuit 150 sets the operation mode of the CMOS image sensor 114 to the second operation mode (step S211). On the other hand, if the shooting time Tv is a short time period less than the preset shooting time y (Tv<y in the step S207), the system control circuit 150 compares between the ISO sensitivity and the predetermined value "x" (step S208).

Then, if the ISO sensitivity is not lower than the predetermined value x (ISO≥x in the step S208), the system control circuit 150 proceeds to the step S211 (i.e. sets the operation mode of the CMOS image sensor 114 to the second operation mode). On the other hand, if the ISO sensitivity is lower than the predetermined value x (ISO<x in the step S208), the system control circuit 150 performs determination of a temperature Temp read out in the step S206 (step S209).

If the temperature Temp is a high temperature not lower than a predetermined value t (not lower than a preset temperature) (Temp≥t in the step S209), the system control circuit 150 proceeds to the step S211. On the other hand, if the temperature Temp is a low temperature lower than the predetermined value t (Temp<t in the step S209), the system control circuit 150 sets the operation mode of the CMOS image sensor 114 to the first operation mode (step S210).

As described above, if the shooting time is short or the temperature is low, the system control circuit 150 determines that the dark current noise is less. Further, if the set ISO sensitivity is low, the optical input is large, so that there is a high possibility that a wide dynamic range of the PD 61 (FIG. 13) is required.

Therefore, the system control circuit 150 sets the operation mode of the CMOS image sensor 114 to the first operation mode, described hereinabove with reference to FIGS. 3 and 4A to 4D, in which it is possible to expand the dynamic range.

On the other hand, as described above, if the shooting time is long, the set ISO sensitivity is high, or the temperature is high, the system control circuit 150 determines that generation of dark current noise is liable to be noticeable. Therefore, the system control circuit 150 sets the operation mode of the CMOS image sensor 114 to the second operation mode, described with reference to FIGS. 5, and 6A to 6E, in which it is possible to suppress the dark current noise.

As described above, in the steps S206 to S211, the system control circuit 150 switches the operation mode of the CMOS image sensor 114 according to the photographing conditions (set shooting time, set photographic sensitivity, etc.) set based on the luminance of the object and the temperature at the time of photographing.

Then, the system control circuit 150 reads out various kinds of correction values (e.g. horizontal and vertical shading correction data), stored in advance, from the nonvolatile memory 156, and loads the correction values into a predetermined area of the memory 130 (step S216).

Thereafter, the system control circuit 150 determines whether or not the shutter switch SW2 is depressed (step S217). If the shutter switch SW2 is not depressed (OFF in the step S217), the system control circuit 150 returns to the step S205.

On the other hand, if the shutter switch SW2 is depressed (ON in the step S217), the system control circuit 150 determines whether or not the memory 130 has an image storing buffer area which can store photographed image data (step S219).

Then, if it is determined that the memory 130 does not have an image storing buffer area which can store photographed image data (NO to the step S219), the system control circuit 150 displays an image on the image display section 128 or outputs sound to a display/sound section (not shown) to perform a predetermined warning (step S220). Thereafter, the system control circuit 150 returns to the step S202.

On the other hand, if it is determined that the memory 130 has an image storing buffer area which can store photographed image data (YES to the step S219), the system control circuit 150 reads out the electric charge accumulated for a predetermined time from each pixel 60 of the CMOS image sensor 114 according to the operation mode set in the above-described step S210 or the step S211.

Then, the system control circuit 150 writes the image data in the predetermined area of the memory 130 via the image processing circuit 120 and the memory control circuit 122 from the AFE 116, or directly via the memory control circuit 122 from the AFE 116 (step S221: photographing process).

It should be noted that the photographing process in the step S221 is the same as the photographing process described in FIG. 9, and hence the description thereof is omitted.

Then, the system control circuit 150 reads out part of the image data written in the predetermined area of the memory 130 via the memory control circuit 122. Then, the system control circuit 150 performs WB (white balance) integral computation processing required to perform development processing.

The system control circuit 150 stores the result of computation in the internal memory thereof or the memory 152. The system control circuit 150 reads out the image data written in the predetermined area of the memory 130 using the memory control circuit 122, and the image processing circuit 120, as required.

The system control circuit 150 performs various kinds of development processing including the AWB (auto white balance) processing, gamma conversion processing, and color conversion processing on the read image data using the result of computation stored in the internal memory of the system control circuit 150 or the memory 152 (step S222).

It should be noted that in the above-mentioned development processing, correction computation processing is performed in combination, using the correction values loaded into the memory 152 in the step S216.

Subsequently, the system control circuit 150 reads out the image data written in the predetermined area of the memory 130 to perform image compression processing according to the set operation mode using the compression/expansion circuit (not shown) (step S223). Then, the system control circuit 150 performs writing the image data on which the sequence of processing operations has been performed in an available image area of the image storing buffer area of the memory 130.

Further, the system control circuit 150 reads out the image data stored in the image storing buffer area of the memory 130, and starts recording processing for writing the image data in the recording medium 1200 (step S224).

The recording start processing is executed on new image data on which the sequence of processing operations has been performed whenever the image data is written in an available image area of the image storing buffer area of the memory 130.

It should be noted that during writing of the image data in the recording medium 1200, the system control circuit 150 performs a recording medium writing operation-indicating operation e.g. by causing the display section (LED or the like: not shown) to blink, so as to indicate that it is during the writing operation.

Thereafter, the system control circuit 150 stores data of the operation mode in the photographing process (e.g. exposure time, shooting date and time) and the like in the memory 152 or the nonvolatile memory 156 (step S225). Then, the system control circuit 150 returns to the step S205. This completes the sequence of processing operations related to shooting.

In the above-described second embodiment, the operation mode is switched between the first operation mode and the second operation according to the combination of the set shooting time, the set ISO sensitivity, and the detected temperature. However, it is not necessary to use all of the set shooting time, the set ISO sensitivity, and the detected temperature. For example, the setting of the first operation mode or the second operation mode may be performed only according to the temperature or only according to the set shooting time. In any case, it is only required that one of the first operation mode and the second operation mode is selected using at least one of the set shooting time, the set ISO sensitivity, and the detected temperature.

Although in the above-described first and second embodiments, the first operation mode and the second operation mode are automatically switched, the automatic switching of the operation mode is not limitative, but the image pickup apparatus may be configured such a changing mode in which the user forcibly changes the operation mode may be provided.

By the way, in the above-described first and second embodiments, the timing of acquiring the photographing conditions of the image pickup operation is set according to the information acquisition before image pickup.

However, in recent years, in view of the advantage of enabling the user to confirm an image to be shot in advance, most of image pickup apparatuses are equipped with a moving image photographing mode in which images obtained by the CMOS image sensor 114 can be displayed on a monitor, as a function of the image pickup apparatus. The moving image-photographing mode includes various kinds of modes, including a mode having only displaying function and a mode having a recording function.

An image pickup apparatus according to the third embodiment, described hereinbelow, has the moving image photographing mode, and acquires still image-photographing conditions when the apparatus is in the moving image photographing mode. The present embodiment is distinguished from the above-described first and second embodiments only in that the moving image photographing mode is provided, and a moving image photographing process described with reference to FIGS. 11A and 11B and a photographing process described with reference to FIG. 12 are executed, and hence redundant description is omitted.

Figure 11A:
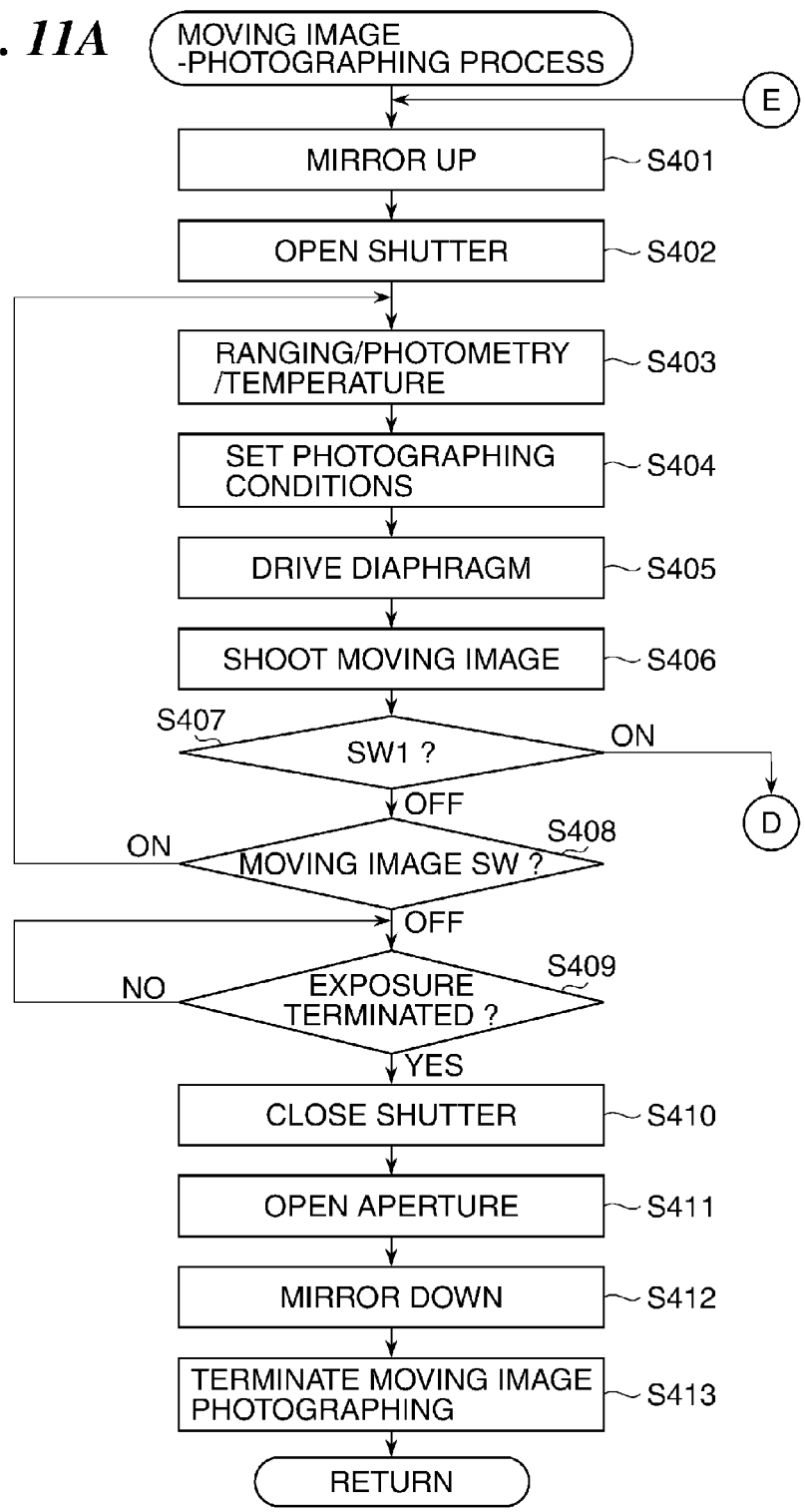
FIG. 11A A flowchart of a process for controlling an image pickup apparatus according to a third embodiment of the present invention.
Figure 11B:
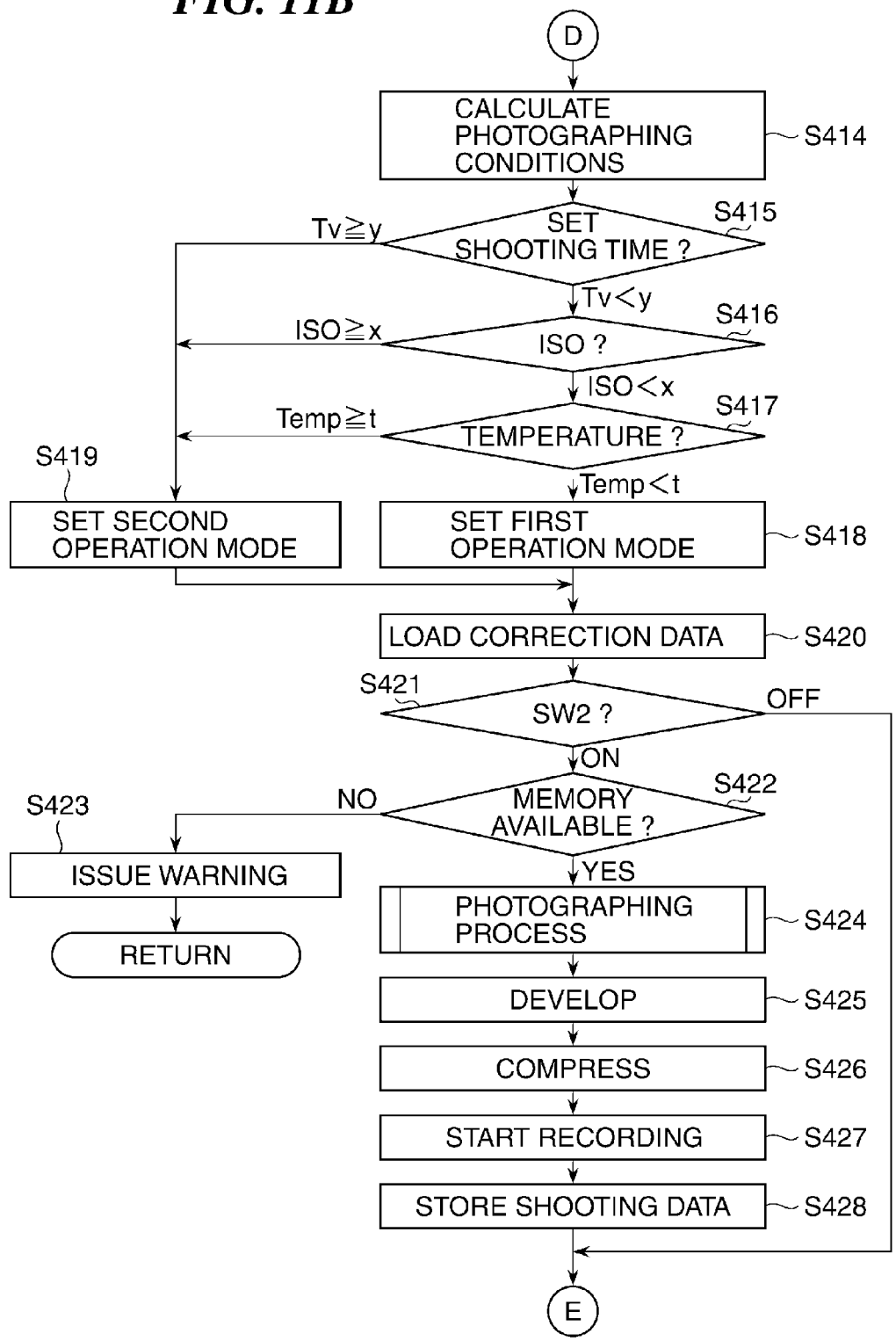
FIG. 11B A continuation of FIG. 11A.
Figure 12:
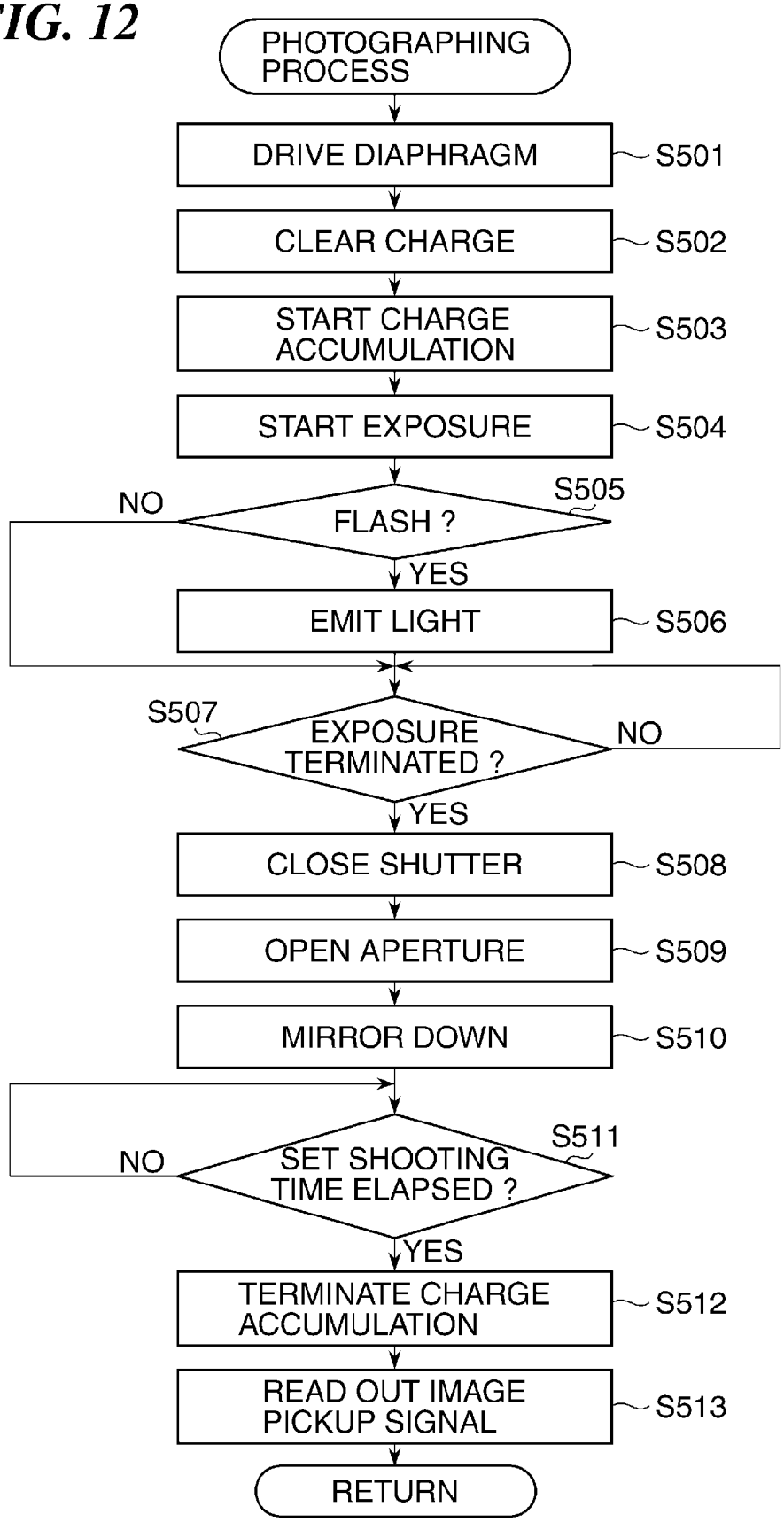
FIG. 12 A flowchart showing details of the photographing process in FIG. 11B.

FIGS. 11A and 11B are a flowchart of the moving image photographing process executed by the image pickup apparatus according to the third embodiment.

Referring to FIGS. 1, 11A, and 11B, when shooting a moving image, an EVF operation switch of the switch block 160 is turned on. By doing this, the system control circuit 150 drives the mirror (not shown) such that it is moved to the mirror up position (step S401).

Then, the system control circuit 150 opens the shutter 112 by the shutter controller 140, and starts optical input to the CMOS image sensor 114 (step S402).

Next, the system control circuit 150 performs measurement of ranging, photometry, and temperature (step S403). That is, in the step S403, the system control circuit 150 performs ranging/photometry processing for performing ranging processing to focus the photographic lens 110 on the object, and performing photometry processing to determine an aperture value, a shutter speed, and an ISO sensitivity, as described with reference to FIG. 1. Further, the system control circuit 150 measures temperature by the thermometer 144, and stores the measured temperature in a predetermined area of the memory 152.

The system control circuit 150 determines, as the photographing conditions, moving image-photographing conditions of the aperture value, the shutter speed, and the ISO sensitivity, based on the measured values obtained by the ranging processing and photometry processing in the step S403, (step S404). Then, the system control circuit 150 drives the diaphragm (not shown) to the aperture value set in the step S404 (step S405).

Then, the system control circuit 150 executes moving image photographing (step S406). That is, the system control circuit 150 executes a slit rolling shutter operation for performing the charge clear and exposure operation in the CMOS image sensor 114. It should be noted that the slit rolling shutter operation is well known, and hence a description thereof is omitted.

Thereafter, the system control circuit 150 determines whether or not the shutter switch SW1 is depressed (step S407). If the shutter switch SW1 is not depressed (OFF in the step S407), the system control circuit 150 determines whether or not a moving image SW (EVF operation SW) remains on (step S408).

If the EVF operation switch is on (ON in the step S408), the system control circuit 150 returns to the step S403. On the other hand, if the EVF operation switch is off (OFF in the step S408), the system control circuit 150 determines whether or not the exposure operation is terminated according to the measured value in the photometry processing (step S409).

If the exposure operation is terminated (YES to the step S409), the system control circuit 150 closes the shutter 112 by the shutter controller 140 to terminate the exposure to the CMOS image sensor 114 (step S410).

If the exposure operation is not terminated (NO to the step S409), the system control circuit 150 waits until the exposure operation is terminated.

Then, the system control circuit 150 drives the diaphragm to the open aperture value (step S411) and moves the mirror to the mirror down position (step S412).

Thereafter, the system control circuit 150 determines whether or not the set charge accumulation time has elapsed, and if the set charge accumulation time has elapsed, the charge accumulation in the CMOS image sensor 114 is terminated. Then, the system control circuit 150 reads out electric charge from each pixel 60 of the CMOS image sensor 114 as the output voltage.

This output voltage is written in the predetermined area of the memory 130 as the photographed image data via the image processing circuit 120 and the memory control circuit 122 from the AFE 116 or directly via the memory control circuit 122 directly from the AFE 116 (moving image photographing is terminated: step S413). The system control circuit 150 thus terminates the sequence of processing operations and then returns to the main process.

If it is determined in the step S407 that the shutter switch SW1 is on, the system control circuit 150 performs processing of reading out the configuration information of the moving image-photographing conditions acquired in the step S404. Then, the system control circuit 150 performs conversion of the read configuration information to information for still images (photographing condition calculation) (step S414).

Then, the system control circuit 150 determines whether or not the shooting time Tv calculated in the step S414 is not less than the predetermined value y (i.e. not less than the preset shooting time: not less than a time period determined in advance; hence, in other words, the shutter speed is not more than a predetermined value) (step S415).

If it is determined that the shooting time Tv is not less than the preset shooting time y (Tv≥y in the step S415), the system control circuit 150 sets the operation mode of the CMOS image sensor 114 to the second operation mode (step S419). On the other hand, if it is determined that the shooting time Tv is less than the preset shooting time y (Tv<y in the step S415), the system control circuit 150 compares between the set ISO sensitivity and the predetermined value x (step S416).

Then, if the ISO sensitivity is not lower than the predetermined value x (ISO≥x in the step S416), the system control circuit 150 proceeds to the step S419 (i.e. sets the operation mode of the CMOS image sensor 114 to the second operation mode). On the other hand, if the ISO sensitivity is lower than the predetermined value x (ISO<x in the step S416), the system control circuit 150 performs determination as to the temperature calculated in the above-described step S414 (step S417).

If the above-mentioned temperature Temp is not lower than a predetermined value t (Temp≥t in the step S417), the system control circuit 150 proceeds to the step S419. On the other hand, if the temperature Temp is lower than the predetermined value t (Temp<t in the step S417), the system control circuit 150 sets the operation mode of the CMOS image sensor 114 to the first operation mode (step S418).

As described above, if the shooting time is short or the temperature is low, the system control circuit 150 determines that the dark current noise is less. Further, if the set ISO sensitivity is low, the optical input is large, so that there is a high possibility that a wide dynamic range of the PD 61 (FIG. 13) is required.

Therefore, the system control circuit 150 sets the operation mode of the CMOS image sensor 114 to the first operation mode, described with reference to FIGS. 3 and 4A to 4D, in which it is possible to expand the dynamic range.

On the other hand, as described above, if the shooting time is long, the set recording sensitivity is high, or the temperature is high, the system control circuit 150 determines that generation of the dark current noise is liable to be noticeable. Therefore, the system control circuit 150 sets the operation mode of the CMOS image sensor 114 to the second operation mode, described with reference to FIGS. 5, and 6A to 6E, in which it is possible to suppress the dark current noise.

As described above, still image-photographing conditions are determined based on the moving image-photographing conditions measured in the moving image-photographing operation described in the steps S403 to S404, and according to the determined still image-photographing conditions, the operation mode of the CMOS image sensor 114 is switched.

Then, the system control circuit 150 reads out various kinds of correction values (e.g. horizontal and vertical shading correction data), stored in advance, from the nonvolatile memory 156, and loads the correction values into a predetermined area of the memory 130 (step S420).

Thereafter, the system control circuit 150 determines whether or not the shutter switch SW2 is depressed (step S421). If the shutter switch SW2 is not depressed (OFF in the step S421), the system control circuit 150 returns to the step S401.

On the other hand, if the shutter switch SW2 is depressed (ON in the step S421), the system control circuit 150 determines whether or not the memory 130 has an image storing buffer area which can store photographed image data (step S422).

Then, if it is determined that the memory 130 does not have an image storing buffer area which can store photographed image data (NO to the step S422), the system control circuit 150 displays an image on the image display section 128 or outputs sound to a display/sound section (not shown) to perform a predetermined warning (step S423). Thereafter, the system control circuit 150 terminates the sequence of processing operations, and then returns to the main process.

On the other hand, if it is determined that the memory 130 has an image storing buffer area which can store photographed image data (YES to the step S422), the system control circuit 150 reads out electric charge accumulated for a predetermined time from each pixel 60 of the CMOS image sensor 114 according to the operation mode set in the above-described step S418 or the step S419.

Then, the system control circuit 150 writes the image data in the predetermined area of the memory 130 via the image processing circuit 120 and the memory control circuit 122 from the AFE 116, or directly via the memory control circuit 122 the AFE 116 (step S424: photographing process).

It should be noted that the photographing process in the step S424 will be described hereinafter in further detail with reference to FIG. 12.

Then, the system control circuit 150 reads out part of the image data written in the predetermined area of the memory 130 via the memory control circuit 122. Then, the system control circuit 150 performs WB (white balance) integral computation processing required to perform development processing.

The system control circuit 150 stores the result of computation in the internal memory thereof or the memory 152. The system control circuit 150 reads out the image data written in the predetermined area of the memory 130 using the memory control circuit 122, and if required, the image processing circuit 120.

The system control circuit 150 performs various kinds of development processing including the AWB (auto white balance) processing, gamma conversion processing, and color conversion processing on the read image data using the result of computation stored in the internal memory of the system control circuit 150 or the memory 152 (step S425).

It should be noted that in the above-mentioned development processing, correction computation processing is performed in combination, using the correction value loaded into the memory 152 in the step S425.

Then, the system control circuit 150 reads out the image data written in the predetermined area of the memory 130 to perform image compression processing according to the set operation mode using the compression/expansion circuit (not shown) (step S426). Then, the system control circuit 150 performs writing of the image data on which the sequence of processing operations has been performed in an available image area of the image storing buffer area of the memory 130.

Further, the system control circuit 150 reads out the image data stored in the image storing buffer area of the memory 130, and starts recording processing for writing the image data in the recording medium 1200 (step S427).

This recording start processing is executed on new image data on which the sequence of processing operations has been performed whenever the image data is written in an available image area of the image storing buffer area of the memory 130.

It should be noted that during writing of the image data in the recording medium 1200, the system control circuit 150 performs a recording medium writing operation-indicating operation e.g. by causing the display section (LED or the like: not shown) to blink, so as to indicate that it is during the writing operation.

Thereafter, the system control circuit 150 stores data of the operation mode in the photographing process (e.g. exposure time, shooting date and time) and the like in the memory 152 or the nonvolatile memory 156 (step S428). Then, the system control circuit 150 returns to the step S401. This completes the sequence of processing operations related to photographing.

FIG. 12 is a flowchart showing details of the photographing process in the step S424 in FIG. 11B.

Referring to FIGS. 1 and 12, in the photographing process in the step S424 in FIG. 11B, the system control circuit 150 drives and controls the diaphragm (not shown) to a predetermined aperture value according to the photometry data stored in the internal memory of the system control circuit 150 or the memory 152 (step S501). Then, the charge clear operation (charge reset operation) in the CMOS image sensor 114 is performed (step S502).

The CMOS image sensor 114 is operated according to the operation mode set in the step S418 or S419 described in FIG. 11B.

Then, the system control circuit 150 opens the shutter 112 by the shutter controller 140, and starts the charge accumulation in the CMOS image sensor 114 (step S503). Then, the system control circuit 150 starts exposure to the CMOS image sensor 114 (step S504).

Next, the system control circuit 150 determines whether or not the flash section 148 is required according to the flash flag (step S505). If it is determined that the flash section 148 is required (YES to the step S505), the system control circuit 150 executes control for causing the flash section 148 to emit light (step S506).

Thereafter, the system control circuit 150 determines whether or not the exposure to the CMOS image sensor 114 is terminated according to the photometry data (step S507). If it is determined that the flash section 148 is not required (NO to the step S505), the system control circuit 150 directly proceeds to the step S507.

Then, if the exposure operation is terminated (YES to the step S507), the system control circuit 150 closes the shutter 112 by the shutter controller 140 to terminate exposure to the CMOS image sensor 114 (step S508).

If the exposure operation is not terminated (NO to the step S507), the system control circuit 150 waits until the exposure operation is terminated.

Then, the system control circuit 150 drives and controls the diaphragm to the open aperture value (step S509) and moves the mirror to the mirror down position (step S510).

Then, the system control circuit 150 determines whether or not the set charge accumulation time has elapsed (step S511). If the set charge accumulation time has elapsed (YES to the step S511), the system control circuit 150 sequentially terminates the charge accumulation in the CMOS image sensor 114 line by line (step S512).

Thereafter, the system control circuit 150 reads out the electric charge from each pixel 60 of the CMOS image sensor 114 as the output voltage (i.e. image pickup signal) (step S513). This output voltage is written in the predetermined area of the memory 130 as the image data via the image processing circuit 120 and the memory control circuit 122 from the AFE 116, or directly via the memory control circuit 122 directly from the AFE 116.

If the set charge accumulation time has not elapsed (NO to the step S511), the system control circuit 150 waits until the set charge accumulation time elapses. When the photographing process is thus terminated, the system control circuit 150 proceeds to the step S425 shown in FIG. 11B.

As described above, in the third embodiment, the moving image-photographing conditions are acquired when the moving image-photographing operation is performed, and the still image-photographing conditions are determined according to the moving image-photographing conditions in the still image-photographing operation. Therefore, in the still image photographing, it is possible to not only prevent photographing time lag from being caused by acquisition of the still image-photographing conditions, but also excellently set the photographing conditions of the CMOS image sensor 114.

As described above, in the first to third embodiments, each pixel 60 (image pickup element) has the MEM 68 (charge holding portion) in addition to the PD 61 (photoelectric conversion element) and the FD 64. Further, the CMOS image sensor 114 equipped in the image pickup apparatus 100 has a plurality of pixels 60.

Further, each pixel 60 has the first transfer transistor 62 (first transfer switch) and the second transfer transistor 69 (second transfer switch). The first transfer transistor 62 selectively separates and connects and between the PD 61 and the MEM 68. Further, the second transfer transistor 69 selectively separates and connects between the MEM 68 and the FD 64.

The vertical scanning circuit 77 and the system control circuit 150 (switch controller) selectively drive the second transfer switch between the first and second operation modes. In the first operation mode, during the charge accumulation in the PD 61, the MEM 68 and the FD 64 are in the connected state by the second transfer transistor 69.

On the other hand, in the second operation mode, during the charge accumulation in the PD 61, the MEM 68 and the FD 64 are in the separate state by the second transfer transistor 69. The vertical scanning circuit 77 and the system control circuit 150 switch the first and second operation modes according to the photographing conditions when photographing the object (e.g. ISO sensitivity, shooting time, and temperature of the image pickup apparatus).

Therefore, when the dark current noise is less, and the optical input is large, it is possible to expand the dynamic range, and when the generation of the dark current noise becomes noticeable, it is possible to suppress the dark current noise. As a consequence, in the photographing conditions for high sensitivity photographing or the like, even when the dynamic range is expanded, it is possible to reduce the influence of the dark current noise, thereby making it possible to obtain excellent image quality.

It should be noted that although in the above-described embodiments, the description has been given of the image pickup apparatus 100, similarly, it is also possible to realize the above-described operations by a control method which drives and controls the image pickup apparatus, as processing steps. Further, a computer such as a microprocessor may be caused to operate by using the control program which realizes the above-described operations as processing steps. In this case, the control program is stored in a computer-readable storage medium, and the computer may be caused to read the stored control program.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

| | Reference Signs List |
|---|---|
| 60 | pixel |
| 61 | photo diode (PD) |
| 62 | first transfer transistor |
| 63 | reset transistor |
| 64 | floating diffusion (FD) |
| 65 | amplifier transistor |
| 66 | row selection transistor |
| 67 | vertical output line |
| 68 | charge holding portion (MEM) |
| 69 | second transfer transistor |
| 77 | vertical scanning circuit |
| 114 | CMOS image sensor |

The invention claimed is:

1. An image pickup apparatus comprising:
a photoelectric conversion element configured to generate and accumulate electric charge according to an optical input;
a charge accumulation portion configured to accumulate the electric charge;
a charge holding portion disposed between the photoelectric conversion element and the charge accumulation portion;
a first transfer switch configured to selectively separate and connect between the photoelectric conversion element and the charge holding portion;
a second transfer switch configured to selectively separate and connect between the charge holding portion and the charge accumulation portion; and a controller configured to set an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to an image shooting sensitivity, wherein the controller sets the operation mode to the first operation mode in a case where the image shooting sensitivity is lower than a predetermined sensitivity set in advance, and sets the operation mode to the second operation mode in a case where the image shooting sensitivity is not lower than the predetermined sensitivity set in advance.

2. An image pickup apparatus comprising:
a photoelectric conversion element configured to generate and accumulate electric charge according to an optical input;
a charge accumulation portion configured to accumulate the electric charge;
a charge holding portion disposed between the photoelectric conversion element and the charge accumulation portion;
a first transfer switch configured to selectively separate and connect between the photoelectric conversion element and the charge holding portion;
a second transfer switch configured to selectively separate and connect between the charge holding portion and the charge accumulation portion; and
a controller configured to set an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to a temperature of the image pickup apparatus, wherein the controller sets the operation mode to the first operation mode in a case where the temperature of the image pickup apparatus is lower than a predetermined temperature set in advance, and sets the operation mode to the second operation mode in a case where the temperature of the image pickup apparatus is not lower than the predetermined temperature set in advance.

3. An image pickup apparatus comprising:
a photoelectric conversion element configured to generate and accumulate electric charge according to an optical input;
a charge accumulation portion configured to accumulate the electric charge;
a charge holding portion disposed between the photoelectric conversion element and the charge accumulation portion;
a first transfer switch configured to selectively separate and connect between the photoelectric conversion element and the charge holding portion;
a second transfer switch configured to selectively separate and connect between the charge holding portion and the charge accumulation portion; and
a controller configured to set an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to an image shooting time, wherein the controller sets the operation mode to the first operation mode in a case where the image shooting time is shorter than a predetermined time period set in advance, and sets the operation mode to the second operation mode in a case where the image shooting time is not shorter than the predetermined time period set in advance.

4. A method of controlling an image pickup apparatus including a photoelectric conversion element configured to generate and accumulate electric charge according to an optical input, a charge accumulation portion configured to accumulate the electric charge, a charge holding portion disposed between the photoelectric conversion element and the charge accumulation portion, a first transfer switch configured to selectively separate and connect between the photoelectric conversion element and the charge holding portion, and a second transfer switch configured to selectively separate and connect between the charge holding portion and the charge accumulation portion, the method comprising setting an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to an image shooting sensitivity, wherein the operation mode is set to the first operation mode in a case where the image shooting sensitivity is lower than a predetermined sensitivity set in advance, and the operation mode is set to the second operation mode in a case where the image shooting sensitivity is not lower than the predetermined sensitivity set in advance.

5. A method of controlling an image pickup apparatus including a photoelectric conversion element configured to generate and accumulate electric charge according to an optical input, a charge accumulation portion configured to accumulate the electric charge, a charge holding portion disposed between the photoelectric conversion element and the charge accumulation portion, a first transfer switch configured to selectively separate and connect between the photoelectric conversion element and the charge holding portion, and a second transfer switch configured to selectively separate and connect between the charge holding portion and the charge accumulation portion, the method comprising setting an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to a temperature of the image pickup apparatus, wherein the operation mode is set to the first operation mode in a case where the temperature of the image pickup apparatus is lower than a predetermined temperature set in advance, and the operation mode is set to the second operation mode in a case where the temperature of the image pickup apparatus is not lower than the predetermined temperature set in advance.

6. A method of controlling an image pickup apparatus including a photoelectric conversion element configured to generate and accumulate electric charge according to an optical input, a charge accumulation portion configured to accumulate the electric charge, a charge holding portion disposed between the photoelectric conversion element and the charge accumulation portion, a first transfer switch configured to selectively separate and connect between the photoelectric conversion element and the charge holding portion, and a second transfer switch configured to selectively separate and connect between the charge holding portion and the charge accumulation portion, the method comprising setting an operation mode to one of a first operation mode in which the second transfer switch separates the charge holding portion and the charge accumulation portion during a charge accumulation operation in the photoelectric conversion element, and a second operation mode in which the second transfer switch connects between the charge holding portion and the charge accumulation portion during the charge accumulation operation in the photoelectric conversion element, according to an image shooting time, wherein the operation mode is set to the first operation mode in a case where the image shooting time is shorter than a predetermined time period set in advance, and the operation mode is set to the second operation mode in a case where the image shooting time is not shorter than the predetermined time period set in advance.

* * * * *